(12) United States Patent
Yamauchi et al.

(10) Patent No.: US 11,227,082 B2
(45) Date of Patent: Jan. 18, 2022

(54) INSTALLATION LOCATION DETERMINATION DEVICE AND METHOD FOR INSTALLATION LOCATION DETERMINATION OF RADIO DEVICE

(71) Applicant: FUJITSU LIMITED, Kawasaki (JP)

(72) Inventors: Hiromasa Yamauchi, Kawasaki (JP); Teruhisa Ninomiya, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 617 days.

(21) Appl. No.: 16/013,289

(22) Filed: Jun. 20, 2018

(65) Prior Publication Data

US 2019/0005166 A1 Jan. 3, 2019

(30) Foreign Application Priority Data

Jun. 29, 2017 (JP) .............................. JP2017-126960

(51) Int. Cl.
*G06F 30/20* (2020.01)
*H04W 16/22* (2009.01)
*H04W 16/18* (2009.01)

(52) U.S. Cl.
CPC .............. *G06F 30/20* (2020.01); *H04W 16/18* (2013.01); *H04W 16/22* (2013.01)

(58) Field of Classification Search
CPC ........ G06F 30/20; G06F 30/25; G06F 30/367; G06F 30/398; G06F 2111/00; G06F 2119/22; H04W 16/22; H04W 16/18
See application file for complete search history.

(56) References Cited

U.S. PATENT DOCUMENTS

| 5,574,466 | A | * | 11/1996 | Reed ......................... G01S 3/00 342/359 |
| 2006/0019679 | A1 | * | 1/2006 | Rappaport ............ G01S 5/0252 455/456.5 |

(Continued)

FOREIGN PATENT DOCUMENTS

JP    2009-290333    12/2009

OTHER PUBLICATIONS

Sam Shue, et al., "Procedurally Generated Environments for Simulating RSSI-Localization Applications," SpringSim-CNS Apr. 23-26, 2017, pp. 1-11 (Year: 2017).*

(Continued)

*Primary Examiner* — Steven W Crabb
(74) *Attorney, Agent, or Firm* — Fujitsu Patent Center

(57) ABSTRACT

An installation location determination device for a radio device, includes a memory and a processor. The memory stores device information on a transmitter and a receiver, and environment information. The processor executes a process including, performing first simulation using a ray tracing method based on the device information and the environment information to calculate first received signal strengths at a plurality of installation candidate points, located respectively at centers of a plurality of installation candidate locations where the receiver is to be installed, and a plurality of neighboring points set for each of the installation candidate points within a first distance from the installation candidate point, calculating second received signal strengths in the respective installation candidate locations based on a calculation result of the first received signal strengths, determining an installation location of the receiver based on the second received signal strengths, and outputting the installation location.

9 Claims, 20 Drawing Sheets

(56) References Cited

U.S. PATENT DOCUMENTS

2017/0134899 A1* 5/2017 Chan .................. H04W 24/10
2018/0352379 A1* 12/2018 Kong .................. G01S 5/0252
2019/0380090 A1* 12/2019 Kim .................... H04W 72/10

OTHER PUBLICATIONS

Tan T.D., et al., "Performance Comparison between Simulation and Experimentation of a Specific Indoor Propagation System," UTC IEEE Xplore, pp. 724-729 (Year: 2012).*

Yiming Ji, et al., "ARIADNE: A Dynamic Indoor Signal Map Construction and Localization System," ACM MobiSys '06, pp. 151-164 (Year: 2006).*

* cited by examiner

FIG. 4

ENVIRONMENT INFORMATION MEMORY 34

LAYOUT INFORMATION TABLE 34a

| OBJECT ID | COORDINATES | MATERIAL ID |
|---|---|---|
| OB001 | (x00,y00,z00), (x10,y10,z10),(x20,y20,z20),(x30,y30,z30) | M00 |
| OB002 | (x01,y01,z01), (x11,y11,z11),(x21,y21,z21),(x31,y31,z31) | M01 |
| ⋮ | ⋮ | ⋮ |

MOBILE OBJECT INFORMATION TABLE 34b

| MOBILE OBJECT ID | MOBILE OBJECT MODEL FILE NAME | NUMBER OF ARRANGEMENT PATTERNS | ARRANGEMENT COORDINATES |
|---|---|---|---|
| M001 | m001 | x | (x1,y1,z1), (x2,y2,z2)⋯ |
| M002 | m002 | y | (x3,y3,z3), (x4,y4,z4)⋯ |
| ⋮ | ⋮ | ⋮ | ⋮ |

MATERIAL INFORMATION TABLE 34c

| MATERIAL ID | THICKNESS | ELECTRICAL CHARACTERISTICS |
|---|---|---|
| M00 | T0 | $\varepsilon 0, \rho 0, \cdots$ |
| M01 | T1 | $\varepsilon 0, \rho 0, \cdots$ |
| ⋮ | ⋮ | ⋮ |

FIG. 5

36 DEVICE INFORMATION MEMORY CIRCUIT

TRANSMITTER INFORMATION TABLE — 36a

| DEVICE ID | COORDINATES | ANTENNA ID | TRANSMISSION FREQUENCY | TRANSMISSION POWER | TILT ANGLE | POINTING DIRECTION |
|---|---|---|---|---|---|---|
| Tx1 | (xt1,yt1,zt1) | AN00 | f0 | P0 | t0 | D0 |
| Tx2 | (xt2,yt2,zt2) | AN01 | f1 | P1 | t1 | D1 |
| ⋮ | ⋮ | ⋮ | ⋮ | ⋮ | ⋮ | ⋮ |

RECEIVER INFORMATION TABLE — 36b

| DEVICE ID | INSTALLATION CANDIDATE POINT ID | INSTALLATION CANDIDATE POINT COORDINATES | ANTENNA ID | TILT ANGLE | POINTING DIRECTION | NEIGHBORING POINT INFORMATION ID | NUMBER OF NEIGHBORING POINTS | MAXIMUM AND MINIMUM STRENGTH POINT IDS | |
|---|---|---|---|---|---|---|---|---|---|
| R001 | Rx1 | (xr1,yr1,zr1) | AN02 | t2 | D2 | NPI1 | N1 | T001 | Rx1:NP1/NP5 Rx2:NP6/NP7 |
| | Rx2 | (xr2,yr2,zr2) | | | | | | | |
| | ⋮ | ⋮ | | | | | | | ⋮ |

NEIGHBORING POINT INFORMATION TABLE — 36d

| NEIGHBORING POINT INFORMATION ID | NEIGHBORING POINT ID | NEIGHBORING POINT COORDINATES | STATIC SIMULATION RECEIVED SIGNAL STRENGTH | | MOBILE OBJECT SIMULATION RECEIVED SIGNAL STRENGTH | |
|---|---|---|---|---|---|---|
| NPI1 | NP1 | (xa1,ya1,za1) | T001 | I1 | T001 | p1:I1a, p2:I1b,⋯ |
| | | | T002 | I2 | T002 | p1:I2a, p2:I2b,⋯ |
| | | | ⋮ | ⋮ | ⋮ | ⋮ |
| | NP2 | (xa2,ya2,za2) | T001 | I3 | T001 | p1:I3a, p2:I3b,⋯ |
| | | | T002 | I4 | T002 | p1:I4a, p2:I4b,⋯ |
| | ⋮ | ⋮ | | | | |

NEIGHBORING POINT SETTING INFORMATION TABLE — 36e

| NEIGHBORING POINT SETTING RANGE | RATIO BETWEEN SETTING RANGE AND WAVELENGTH | NEIGHBORING POINT SETTING INTERVAL | RATIO BETWEEN SETTING INTERVAL AND WAVELENGTH |
|---|---|---|---|
| L1 | Ra | d1 | Rb |

ANTENNA INFORMATION TABLE — 36c

| ANTENNA ID | POINTING DIRECTION |
|---|---|
| AN00 | $\theta 0, \phi 0$ |
| AN01 | $\theta 1, \phi 1$ |
| ⋮ | ⋮ |

FIG. 23

|  | Rx1 | Rx2 | Rx3 | Rx4 | Rx5 | AVERAGE |
|---|---|---|---|---|---|---|
| MEASUREMENT [dBm] | -31 | -30 | -35 | -40 | -39 | |
| SIMULATION AT ONE POINT [dBm] | -32.21 | -41.20 | -31.61 | -43.60 | -28.80 | |
| ERROR [dB] | 1.21 | 11.20 | 3.39 | 3.60 | 10.20 | 5.92 |
|  | Rx1 | Rx2 | Rx3 | Rx4 | Rx5 | AVERAGE |
| MEASUREMENT [dBm] | -31 | -30 | -35 | -40 | -39 | |
| SIMULATION AT NINE POINTS [dBm] | -31.77 | -35.31 | -33.32 | -41.94 | -31.22 | |
| ERROR [dB] | 0.77 | 5.31 | 1.68 | 1.94 | 7.78 | 3.50 |
|  | Rx1 | Rx2 | Rx3 | Rx4 | Rx5 | AVERAGE |
| MEASUREMENT [dBm] | -31 | -30 | -35 | -40 | -39 | |
| SIMULATION AT TWO POINTS + ESTIMATION [dBm] | -32.47 | -35.31 | -32.96 | -40.34 | -31.09 | |
| ERROR [dB] | 1.47 | 5.31 | 2.04 | 0.34 | 7.91 | 3.41 |

INSTALLATION LOCATION DETERMINATION DEVICE AND METHOD FOR INSTALLATION LOCATION DETERMINATION OF RADIO DEVICE

CROSS-REFERENCE TO RELATED APPLICATION

This application is based upon and claims the benefit of priority of the prior Japanese Patent Application No. 2017-126960, filed on Jun. 29, 2017, the entire contents of which are incorporated herein by reference.

FIELD

The embodiments discussed herein are related to an installation location determination device and a method for installation location determination of a radio device.

BACKGROUND

There is a technique of determining installation locations of a transmitter and a receiver which are radio devices in a facility or the like by using a ray tracing method which is a method of calculating radio wave paths based on theories of geometrical optics. Conventionally, there has been a technique of evaluating usefulness of the radio wave path calculated by using the ray tracing method by calculating a radio-field strength by use of a probability of a structure being present in the radio wave path.

A related technique is disclosed in Japanese Laid-open Patent Publication No. 2009-290333.

SUMMARY

According to an aspect of the embodiments, an installation location determination device for a radio device, includes, a memory and a processor coupled to the memory. The memory stores device information on a transmitter and a receiver, and environment information. The processor executes a process including, performing first simulation using a ray tracing method based on the device information and the environment information to calculate first received signal strengths at a plurality of installation candidate points, located respectively at centers of a plurality of installation candidate locations where the receiver is to be installed, and a plurality of neighboring points set for each of the installation candidate points within a first distance from the installation candidate point, calculating second received signal strengths in the respective installation candidate locations based on a calculation result of the first received signal strengths, determining an installation location of the receiver based on the second received signal strengths, and outputting the installation location.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 4 is a view illustrating examples of layout information and mobile object information;

FIG. 5 is a view illustrating an example of device information;

FIG. 23 is a table illustrating an example of a difference between the actual measurement result and each of the simulation results at each of installation candidate points.

DESCRIPTION OF EMBODIMENTS

When an installation location of a receiver is to be determined by performing simulation using a ray tracing method, received signal strengths at multiple points are calculated. However, a location at which the received signal strength is weak due to spatial fading caused by effects of multipath or the like may be present near these points. Accordingly, the received signal strength at a certain point which is calculated as the received signal strength in a certain installation candidate location sometimes differs greatly from an actual measurement value which is affected by the spatial fading.

Embodiments are described below with reference to the drawings.

First Embodiment

Figure 1:
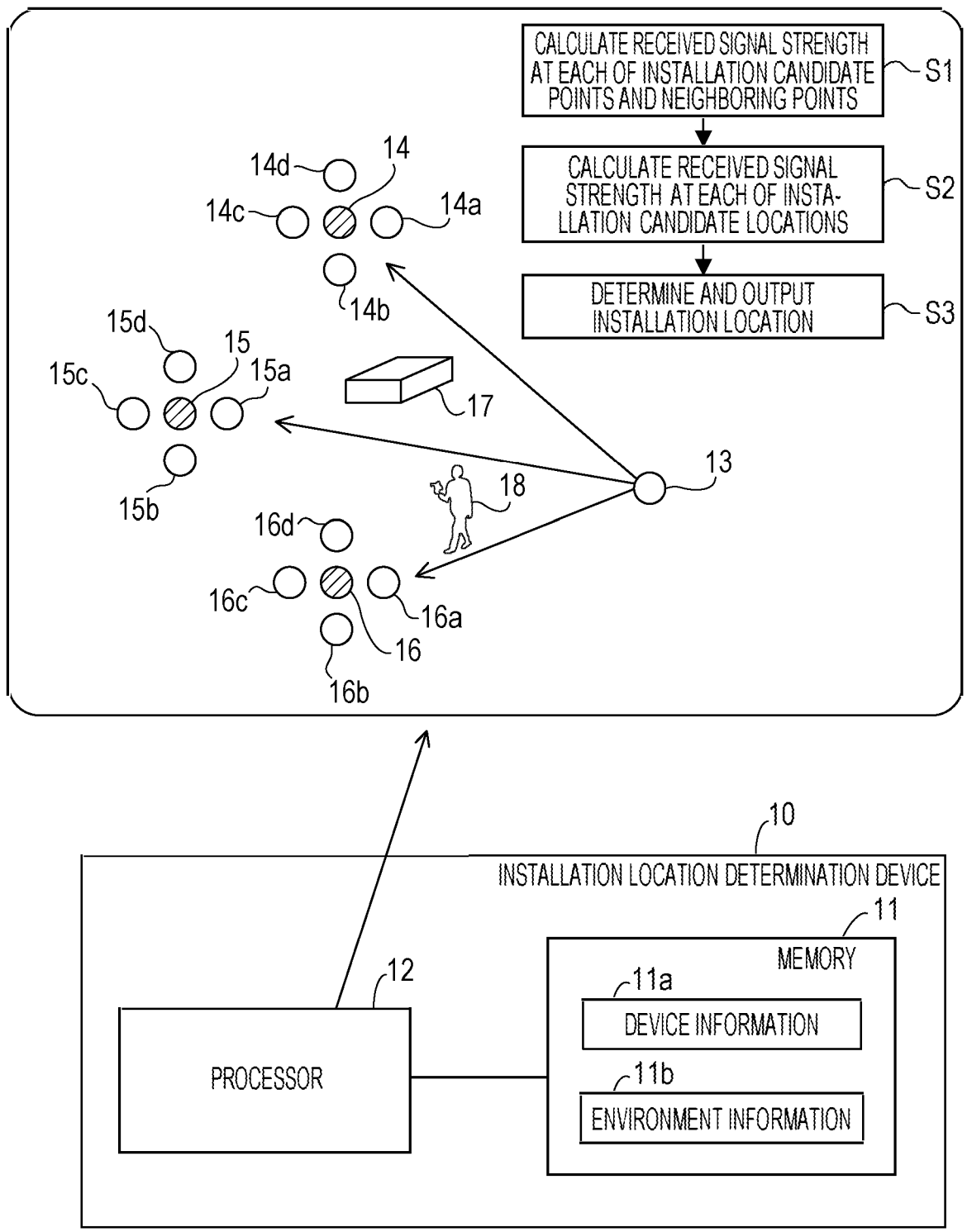
FIG. 1 is a view illustrating an example of an installation location determination device for a radio device in a first embodiment.

FIG. 1 is a view illustrating an example of an installation location determination device for a radio device in a first embodiment.

The installation location determination device 10 is, for example, a computer which determines an installation location of a radio device (particularly, a receiver) which is a radio node included in an Internet of things (IoT) system.

The installation location determination device 10 includes a memory 11 and a processor 12.

The memory 11 is a volatile storage device such as a random access memory (RAM) or a non-volatile storage device such as a flash memory, an electrically erasable programmable read only memory (EEPROM), or a hard disk drive (HDD).

The memory 11 stores device information 11a and environment information 11b. The device information 11a is information on a transmitter and a receiver which receives radio waves transmitted by the transmitter. The device information 11a includes, for example, coordinates of a position at which the transmitter is installed, coordinates of multiple installation candidate points indicating candidates of a position where the receiver is to be installed, the types, the tilt angles, the pointing directions, the transmission frequency, and the transmission power of antennas of the transmitter and the receiver, and the like.

The environment information 11b is information on an environment in which communication between the transmitter and the receiver is performed. The environment information 11b includes, for example, coordinates, materials, electrical characteristics, and the like of objects (walls and the like) and a mobile object present in the environment in which the communication between the transmitter and the receiver is performed.

Note that the installation location determination device 10 may receive input made by a user and create the device information 11a and the environment information 11b based on the input. Alternatively, the installation location determination device 10 may obtain the device information 11a and the environment information 11b from another device.

The processor 12 is a processor which serves as a computation processing device such as a central processing unit (CPU) or a digital signal processor (DSP). Note that the processor 12 may include an electronic circuit for a specific application such as an application specific integrated circuit (ASIC) and a field programmable gate array (FPGA). The processor executes programs stored in the memory such as the RAM. Note that a group of multiple processors may sometimes be referred to as "multiprocessor" or simply "processor".

The processor 12 obtains (reads) the device information 11a and the environment information 11b from the memory 11. Then, the processor 12 performs simulation using the ray tracing method based on the device information 11a and the environment information 11b to calculate the received signal strength at each of the multiple installation candidate points and the multiple neighboring points set for each of the multiple installation candidate points within a first distance from the installation candidate point. The multiple installation candidate points are points respectively at the centers of installation candidate locations where the receiver is to be installed.

Thereafter, the processor 12 calculates the received signal strength in the respective installation candidate locations based on the calculation result of the received signal strengths at the aforementioned points, determines the installation location of the receiver based on the calculated received signal strengths, and outputs the installation location. A setting method of the neighboring points is described later.

FIG. 1 illustrates an example of a method of determining the installation location of the receiver. FIG. 1 illustrates a transmission point 13 where the transmitter is to be installed and three installation candidate points 14, 15, 16 set at the centers of the three installation candidate locations for the receiver. Four neighboring points are set for each of the installation candidate points 14 to 16. Specifically, neighboring points 14a, 14b, 14c, 14d are set for the installation candidate point 14, neighboring points 15a, 15b, 15c, 15d are set for the installation candidate point 15, and neighboring points 16a, 16b, 16c, 16d are set for the installation candidate point 16.

The processor 12 performs the simulation using the ray tracing method based on the device information 11a and the environment information 11b to calculate the received signal strength at each of the installation candidate points 14 to 16 and the neighboring points 14a to 14d, 15a to 15d, 16a to 16d (step S1). In the simulation using the ray tracing method, the received signal strength is calculated in consideration of an object 17 and a mobile object 18 which are included in an environment in which communication by the transmitter and the receiver is to be performed and which reflect, absorb, or diffract radio waves. The processor 12 may store the calculation result of the received signal strength in the memory 11.

Next, the processor 12 calculates the received signal strength in each of the installation candidate locations based on the calculation result of the received signal strengths at the aforementioned points (step S2). For example, the processor 12 calculates the average value of the received signal strengths at the installation candidate point 14 and its neighboring points 14a to 14d as the received signal strength in the installation candidate location with the installation candidate point 14 at the center. Moreover, the processor 12 calculates the average value of the received signal strengths at the installation candidate point 15 and its neighboring points 15a to 15d as the received signal strength in the installation candidate location with the installation candidate point 15 at the center. Similarly, the processor 12 calculates the average value of the received signal strengths at the installation candidate point 16 and its neighboring points 16a to 16d as the received signal strength in the installation candidate location with the installation candidate point 16 at the center.

Then, the processor 12 determines the installation location of the receiver based on the determined received signal strengths in the respective installation candidate locations and outputs the installation location (step S3). For example, the processor 12 determines the installation candidate location with the highest received signal strength as the installation location of the receiver. The installation location outputted by the processor 12 is, for example, stored in the memory 11. Moreover, the processor 12 may display the determined installation location on a not-illustrated display.

As described above, when the installation location determination device 10 obtains the received signal strength in each installation candidate location in the simulation using the ray tracing method to determine the installation location of the receiver, the installation location determination device 10 calculates the received signal strengths also at the neighboring points provided for each installation candidate point. Then, the installation location determination device 10 calculates the received signal strength in each installation candidate location based on the calculation result of the neighboring points. Effects of spatial fading caused by effects of multipath or the like are thereby reflected also in the simulation using the ray tracing method and calculation accuracy of the received signal strength in each installation candidate location is improved. Hence, it is possible to determine an installation location at which radio commutation is performed more stably.

Note that, although the case where one transmitter is used is described in the aforementioned example, the embodiment is not limited to this. When multiple transmitters are used, the received signal strengths of radio waves transmitted by the respective transmitters are calculated. Then, for example, the installation candidate location in which the aforementioned average values of the received signal strengths of the radio waves transmitted by transmitters are all higher than a reference value (for example, receiving sensitivity of the receiver) at the installation candidate point may be set as the installation location of the receiver.

Since the installation location determination device 10 of the first embodiment calculates the received signal strengths also at the multiple neighboring points, the calculation amount increases particularly when there are many arrangement patterns (arrangement locations) of the mobile object, and the calculation time may increase. In the following description, an installation location determination device of a second embodiment capable of reducing the calculation amount and the calculation time is described.

Second Embodiment

Figure 2:
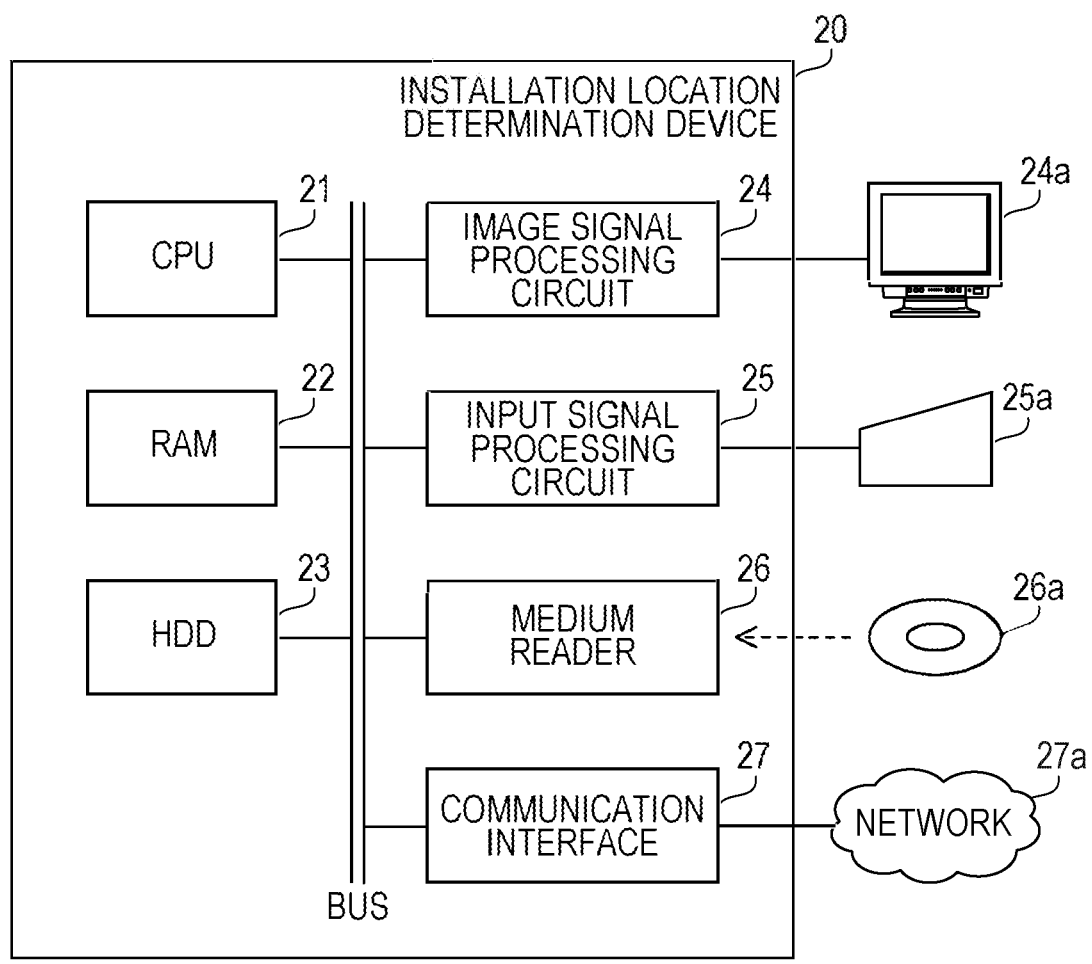
FIG. 2 is a block diagram illustrating a hardware example of the installation location determination device.

FIG. 2 is a block diagram illustrating a hardware example of the installation location determination device. The installation location determination device 20 includes a CPU 21, a RAM 22, an HDD 23, an image signal processing circuit 24, an input signal processing circuit 25, a medium reader 26, and a communication interface 27. These units are connected to a bus.

The CPU 21 is a processor including a computation circuit which executes instructions of programs. The CPU 21 loads at least part of a program or data stored in the HDD 23 onto the RAM 22 to execute the program. Note that the configuration may be such that the CPU 21 includes multiple processor cores or the installation location determination device 20 includes multiple processors and the processes described below are executed in parallel by using the multiple processors or processor cores. Moreover, a group of multiple processors (multiprocessor) may be referred to as "processor".

The RAM 22 is a volatile semiconductor memory which temporarily stores the programs executed by the CPU 21 and the data used by the CPU 21 for computation. Note that the installation location determination device 20 may include a memory of a type other than the RAM and may include multiple memories.

The HDD 23 is a non-volatile storage device which stores data and programs of an operating system (OS), middleware, and software such as application software. The programs include, for example, a program which causes the installation location determination device 20 to execute an installation location determination process. Note that the installation location determination device 20 may include other types of storage devices such as a flash memory and a solid state drive (SSD) and may include multiple non-volatile storage devices.

The image signal processing circuit 24 outputs an image to a display 24a connected to the installation location determination device 20 according to an instruction from the CPU 21. A cathode ray tube (CRT) display, a liquid crystal display (LCD), a plasma display panel (PDP), an organic electro-luminescence (OEL) display, or the like may be used as the display 24a.

The input signal processing circuit 25 obtains an input signal from an input device 25a connected to the installation location determination device 20 and outputs the input signal to the CPU 21. A pointing device such as a mouse, a touch panel, a touch pad, or a track ball, a keyboard, a remote controller, a button switch, or the like may be used as the input device 25a. Moreover, multiple types of input devices may be connected to the installation location determination device 20.

The medium reader 26 is a reading device which reads programs and data stored in a recording medium 26a. A magnetic disk, an optical disc, a magneto-optical disk (MO), a semiconductor memory, and the like may be used as the recording medium 26a. The magnetic disk includes a flexible disk (FD) and a HDD. The optical disc includes a compact disc (CD) and a digital versatile disc (DVD).

The medium reader 26 copies, for example, the programs and data read from the recording medium 26a to another recording medium such as the RAM 22 and the HDD 23. The read program is executed by, for example, the CPU 21. Note that the recording medium 26a may be a portable recording medium and is sometimes used for distribution of the programs and data. Moreover, the recording medium 26a and the HDD 23 are sometimes referred to as computer readable recording media.

The communication interface 27 is an interface which is connected to a network 27a to perform communication with other information processing apparatuses via the network 27a. The communication interface 27 may be a wired communication interface connected to a communication device such as a switch via a cable or a radio communication interface connected to a base station via a radio link.

Figure 3:
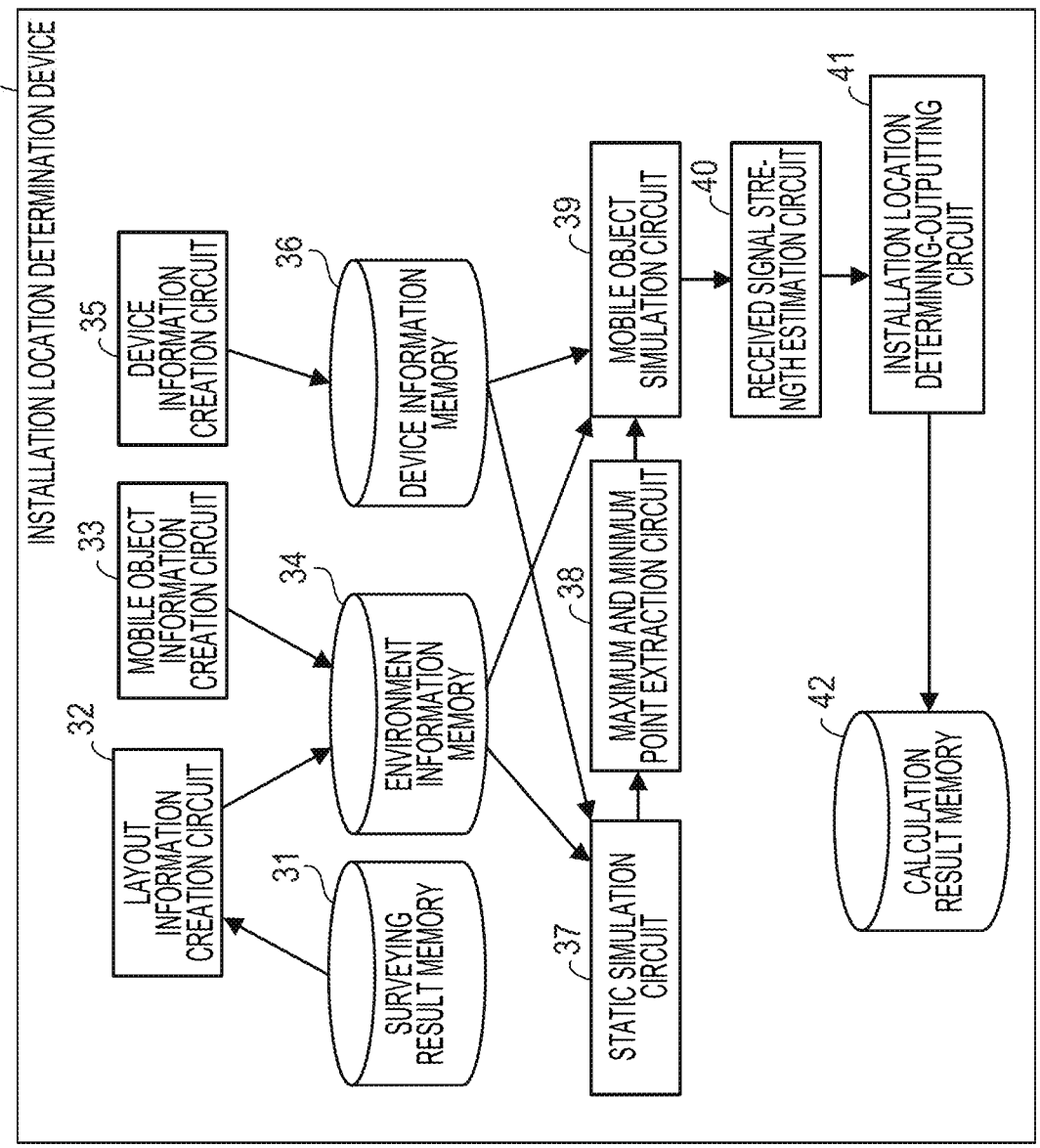
FIG. 3 is a block diagram illustrating examples of functions of the installation location determination device.

Next, functions and processing steps of the installation location determination device 20 are described. FIG. 3 is a block diagram illustrating examples of functions of the installation location determination device. The installation location determination device 20 includes a surveying result storage circuit 31, a layout information creation circuit 32, a mobile object information creation circuit 33, an environment information storage circuit 34, a device information creation circuit 35, a device information storage circuit 36, and a static simulation circuit 37. The installation location determination device 20 also includes a maximum and minimum point extraction circuit 38, a mobile object simulation circuit 39, a received signal strength estimation circuit 40, an installation location determining-outputting circuit 41, and a calculation result storage circuit 42.

The surveying result storage circuit 31, the environment information storage circuit 34, the device information storage circuit 36, and the calculation result storage circuit 42 may be implemented by using, for example, a storage region provided in the RAM 22 or the HDD 23. The other functional blocks may be implemented by using, for example, program modules executed by the CPU 21.

The surveying result storage circuit 31 stores a surveying result of an environment in which radio communication using the transmitter and the receiver is to be performed. The surveying is performed by using, for example, a 3D scanner. In this case, the surveying result is three-dimensional data.

The layout information creation circuit 32 obtains the surveying result from the surveying result storage circuit 31. Then, the layout information creation circuit 32 receives, for example, input made by the user and creates layout information based on the received input by performing creation of surfaces, setting of thickness, specification of materials, and the like for objects included in the surveying result. Moreover, the layout information creation circuit 32 may create the layout information by obtaining a two-dimensional image such as a floor map and performing the creation of surfaces, the setting of thickness, the specification of materials, and the like based on input made by the user.

The mobile object information creation circuit 33, for example, receives input made by the user and creates mobile object information on a mobile object based on the received input. The mobile object information includes, for example, coordinates indicating a three-dimensional shape of a model of the mobile object, a material, the number of arrangement patterns of the mobile object (number of arrangement positions), coordinates of each arrangement pattern, and the like.

The environment information storage circuit 34 stores environment information including the layout information and the mobile object information. The device information creation circuit 35 receives, for example, input made by the user and creates device information on the transmitter and the receiver which receives radio waves transmitted by the transmitter, based on the received input. The device information includes, for example, coordinates of a position where the transmitter is installed, coordinates of an installation candidate point set at the center of an installation candidate location where the receiver is to be installed, the types, the tilt angles, the pointing directions, the transmission frequency, and the transmission power of antennas of the transmitter and the receiver, and the like. In the following description, the device information is assumed to also include identifications (IDs) and coordinates of neighboring points set near each installation candidate point, the number of neighboring points, and various parameters (described later) for setting the neighboring points.

The device information storage circuit 36 stores the device information. The static simulation circuit 37 calculates received signal strengths at all installation candidate points and all neighboring points by performing simulation using the ray tracing method in a condition including no mobile object (hereafter referred to as static simulation), based on the environment information and the device information.

The maximum and minimum point extraction circuit 38 extracts, for each installation candidate point, a point at which the received signal strength is greatest (hereafter, referred to as a maximum strength point) and a point at which the received signal strength is smallest (hereafter referred to as a minimum strength point) from a group including the installation candidate point and the multiple neighboring points of this installation candidate point, based on the result of the static simulation.

The mobile object simulation circuit 39 performs simulation using the ray tracing method in a condition including the mobile object (hereafter, referred to as mobile object simulation) only for the maximum strength point and the minimum strength point in each group including the installation candidate point and its neighboring points to calculate the received signal strengths.

The received signal strength estimation circuit 40 calculates (estimates) the received signal strengths at the installation candidate point or the neighboring points for which no mobile object simulation is performed, based on the calculation result of the received signal strengths at the maximum strength point and the minimum strength point.

The installation location determining-outputting circuit 41 calculates the received signal strengths in the respective installation candidate locations based on the received signal strengths calculated by the mobile object simulation circuit 39 and the received signal strength estimation circuit 40, determines the installation location of the receiver based on the calculated received signal strengths, and outputs the result of the determination. The installation location determining-outputting circuit 41 may output the determined installation location to the calculation result storage circuit 42 and display the determined installation location on the display 24a illustrated in FIG. 2.

The calculation result storage circuit 42 stores the installation location of the receiver outputted by the installation location determining-outputting circuit 41. Note that the aforementioned functional blocks may be executed by one installation location determination device 20 (computer) or by multiple computers. For example, the processes of the layout information creation circuit 32, the mobile object information creation circuit 33, and the device information creation circuit 35 may be executed in another computer. In this case, the installation location determination device 20 obtains the layout information, the mobile object information, and the device information created in another computer and stores them in the environment information storage circuit 34 and the device information storage circuit 36.

FIG. 4 is a view illustrating examples of the layout information and the mobile object information. FIG. 4 illustrates a layout information table 34a including the layout information, a mobile object information table 34b including the mobile object information, and a material information table 34c including information on materials.

The layout information table 34a includes an ID of each object, four sets of coordinates of created surfaces, and an ID of the material of each object. The ID of material is selected from the material information table 34c. The mobile object information table 34b includes an ID of each mobile object, a file name of a model of each mobile object, the number of arrangement patterns of each mobile object, and the coordinates of each arrangement pattern (arrangement coordinates). The file name of the model of each mobile object is a name of a file including information similar to those in the layout information table 34a and the material information table 34c such as the material and the coordinates indicating the three-dimensional shape of the model of the mobile object. Although illustration is omitted, this file is also stored in, for example, the environment information storage circuit 34.

The material information table 34c includes the ID of each material, thickness of each material, and electrical characteristics (characteristic data such as relative permittivity and electrical conductivity) of each material.

FIG. 5 is a view illustrating an example of the device information. FIG. 5 illustrates a transmitter information table 36a including information on the transmitters, a receiver information table 36b including information on the receivers, and an antenna information table 36c. Moreover, in the example of FIG. 5, there are illustrated the neighboring point information table 36d including information on the neighboring points and the neighboring point setting information table 36e including information on the setting of the neighboring points.

The transmitter information table 36a includes a device ID of each transmitter, coordinates of a position where each transmitter is installed, an ID, transmission frequency, transmission power, a tilt angle, and a pointing direction of an antenna used in each transmitter. The ID of the antenna is selected from the antenna information table 36c.

The receiver information table 36b includes a device ID of each receiver, an ID of each installation candidate point, coordinates of each installation candidate point, and an ID, a tilt angle, and a pointing direction of an antenna used in each receiver. The receiver information table 36b also includes an ID of information on the neighboring points set near the installation candidate points and the number of the neighboring points. Moreover, as illustrated in FIG. 5, the receiver information table 36b may include the IDs of the maximum strength point and the minimum strength point extracted by the maximum and minimum point extraction circuit 38. The maximum strength point and the minimum strength point are obtained for each transmitter and each installation candidate point (installation candidate location). For example, "Rx1:NP1/NP5" in the example of FIG. 5 indicates that a neighboring point with the neighboring point ID of "NP1" is the maximum strength point and a neighboring point with the neighboring point ID of "NP5" is the minimum strength point, among the multiple neighboring points for the installation candidate point with the installation candidate point ID of "Rx1".

The antenna information table 36c includes an ID of each antenna and directivity (indicated by two types of angles in a polar coordinate system) of each antenna. The neighboring point information table 36d includes the ID of information on the neighboring points, the ID of each neighboring point included in the neighboring point information, and coordinates of each neighboring point. As illustrated in FIG. 5, the neighboring point information table 36d may also include the received signal strength at each neighboring point for each transmitter calculated in the static simulation. Moreover, as illustrated in FIG. 5, the neighboring point information table 36d may include the received signal strength for each transmitter and each arrangement pattern ("p1", "p2", and the like) of the mobile object which is calculated in the mobile object simulation or estimated by the received signal strength estimation circuit 40.

The neighboring point setting information table 36e includes a setting range of the neighboring points, a ratio between the setting range and a wavelength of the radio wave, a setting interval of the neighboring points, and a ratio between the setting interval and the wavelength of the radio wave. For example, the configuration may be such that, when the user sets the ratio between the setting range and the wavelength of the radio wave and the ratio between the setting interval and the wavelength of the radio wave, the device information creation circuit 35 calculates the setting range and the setting interval of the neighboring points based on these ratios.

(Example of Installation Location Determination Method)

Description is given below of an example of a method of determining the installation location of the receiver by using the installation location determination device 20 illustrated in FIG. 3.

Note that, prior to the processes by the installation location determination device 20, the environment in which the transmitter and the receiver are to be installed is studied or surveyed by using, for example, a 3D scanner. The installation location determination device 20 obtains the surveying result and stores the surveying result in the surveying result storage circuit 31.

Figure 6:
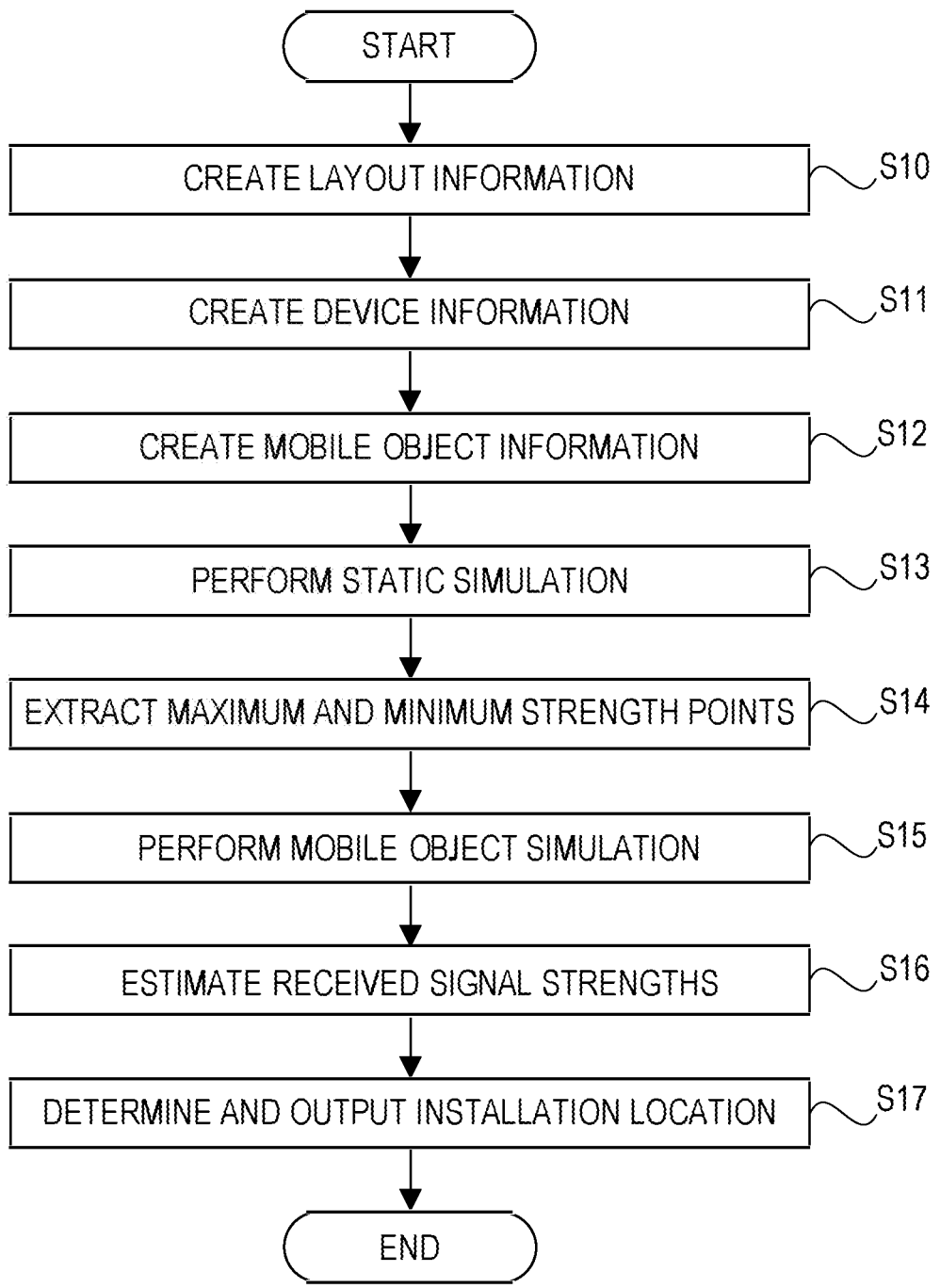
FIG. 6 is a flowchart illustrating a flow of an example of an installation location determination method.

FIG. 6 is a flowchart illustrating a flow of an example of the installation location determination method.

(Step S10) The layout information creation circuit 32 obtains the surveying result from the surveying result storage circuit 31 and receives, for example, input made by the user to create the layout information based on the received input.

(Step S11) The device information creation circuit 35 receives, for example, input made by the user and creates the device information on the transmitter and the receiver based on the received input.

(Step S12) The mobile object information creation circuit 33 receives, for example, input made by the user and creates the mobile object information on the mobile object based on the received input.

(Step S13) The static simulation circuit 37 performs the static simulation based on the environment information and the device information to calculate the received signal strengths at all installation candidate points and all neighboring points.

(Step S14) The maximum and minimum point extraction circuit 38 extracts, for each installation candidate point, the maximum strength point and the minimum strength point from a group including the installation candidate point and the multiple neighboring points of the installation candidate point, based on the calculation result of the received signal strengths obtained in the static simulation.

(Step S15) The mobile object simulation circuit 39 performs the mobile object simulation only for the maximum strength point and the minimum strength point in each group including the installation candidate point and its neighboring points to calculate the received signal strengths in each arrangement pattern of the mobile object.

(Step S16) The received signal strength estimation circuit 40 calculates (estimates) the received signal strengths at the installation candidate point or the neighboring points for which no mobile object simulation is performed, based on the calculation result of the received signal strengths at the maximum strength point and the minimum strength point for which the mobile object simulation is performed.

(Step S17) The installation location determining-outputting circuit 41 calculates the received signal strengths in the respective installation candidate locations based on the received signal strengths calculated by the mobile object simulation circuit 39 and the received signal strength estimation circuit 40, determines the installation location of the receiver based on the calculated received signal strengths, and outputs the result of the determination.

Note that the aforementioned order of the processes of steps S10 to S17 is an example, and the order is not limited to the one described above. For example, the process order of steps S11 and S12 may be switched. Examples of processes in the aforementioned steps are described below.

Figure 7:
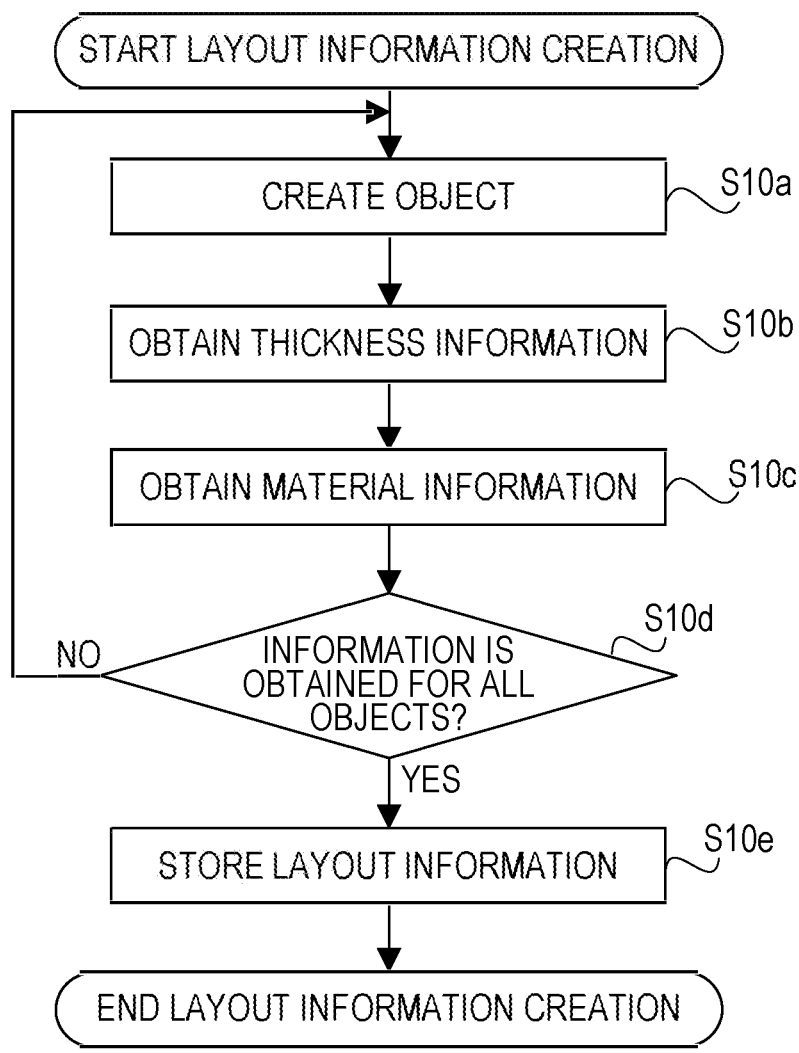
FIG. 7 is a flowchart illustrating a flow of an example of a layout information creation process.

FIG. 7 is a flowchart illustrating a flow of an example of a layout information creation process.

(Step S10a) The layout information creation circuit 32 obtains the surveying result from the surveying result storage circuit 31 and displays three-dimensional data based on the surveying result as a three-dimensional image on, for example, the display 24a illustrated in FIG. 2. Then, the layout information creation circuit 32 receives creation of objects made by an operation of the user on the input device 25a. Alternatively, the layout information creation circuit 32 displays two-dimensional image data and receives creation of objects.

Then, the layout information creation circuit 32 creates surfaces of the objects. Each surface is expressed by, for example, four sets of coordinates.

(Step S10b) The layout information creation circuit 32 obtains thickness information of each object (for example, the thickness of a wall) inputted by an operation of the user on the input device 25a.

(Step S10c) The layout information creation circuit 32 obtains material information of each object inputted by an operation of the user on the input device 25a. For example, the user specifies a material ID in the material information table 34c illustrated in FIG. 4 and the layout information creation circuit 32 obtains the specified material ID as the material information.

(Step S10d) The layout information creation circuit 32 determines whether information on all objects to be created is obtained from the user. When the layout information creation circuit 32 receives a signal requesting creation of a new object, the processes from step S10a are repeated. When the layout information creation circuit 32 receives a signal indicating completion of the creation of objects, the process of step S10e is performed.

(Step S10e) The layout information creation circuit 32 registers information obtained in the processes up to step S10d in, for example, the layout information table 34a and the material information table 34c as illustrated in FIG. 4 to store the layout information in the environment information storage circuit 34. The creation of the layout information is thereby completed.

Figure 8:
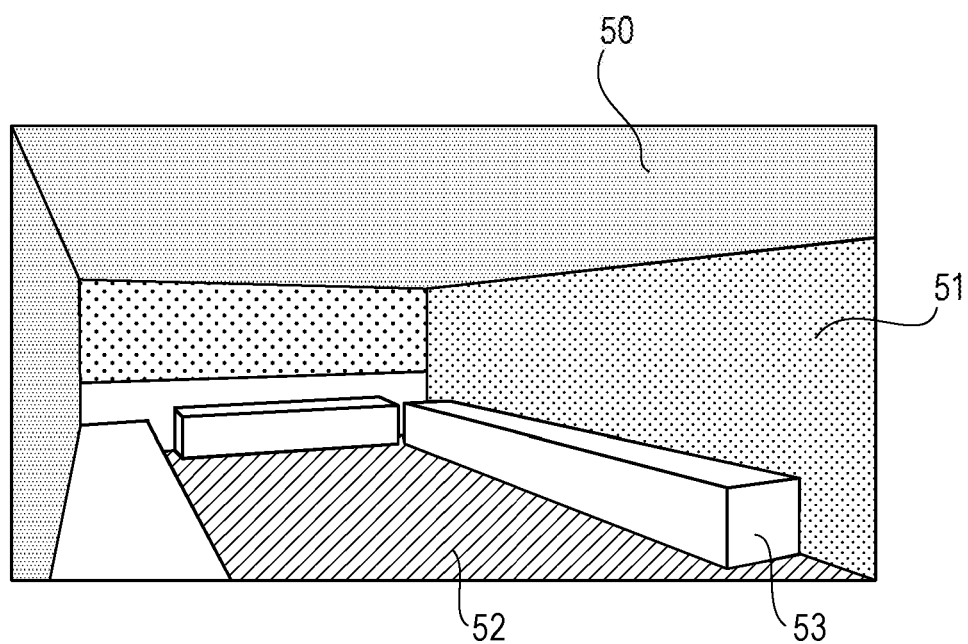
FIG. 8 is a view illustrating an example of a layout creation result.

FIG. 8 is a view illustrating an example of a layout creation result. FIG. 8 illustrates a three-dimensional image of an inside of a certain facility. Objects such as a ceiling 50, a wall 51, a floor 52, and a desk 53 are illustrated.

Figure 9:
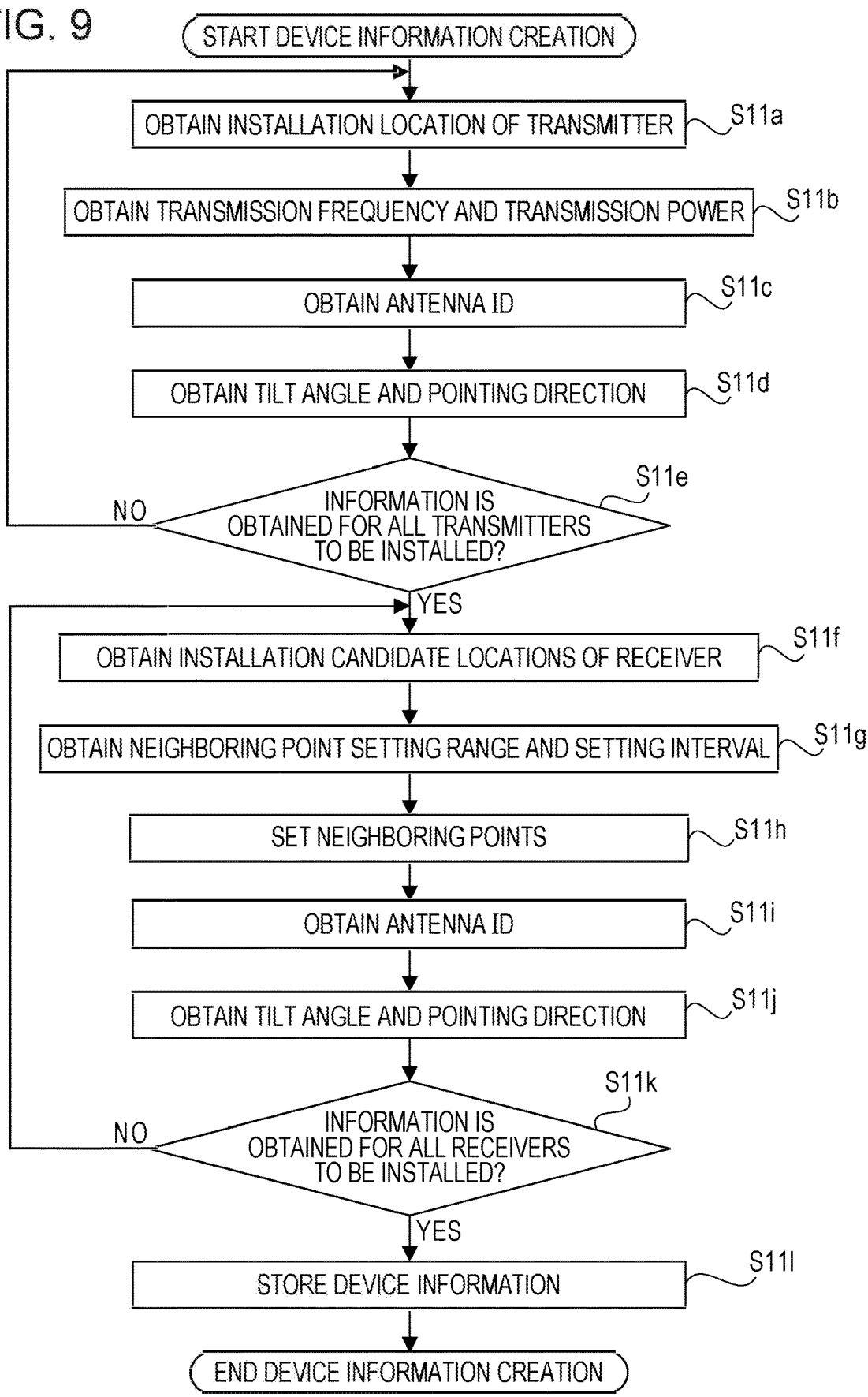
FIG. 9 is a flowchart illustrating a flow of an example of a device information creation process.

Note that the aforementioned order of the processes of steps S10b and 10c is an example and the order is not limited to one described above. The order of the processes may be switched as appropriate. FIG. 9 is a flowchart illustrating a flow of an example of a device information creation process.

(Steps S11a, S11b, S11c, S11d) The device information creation circuit 35 obtains the installation location, the transmission frequency, the transmission power, the antenna ID, the tilt angle, and the pointing direction of the transmitter which are inputted by an operation of the user on the input device 25a.

(Step S11e) The device information creation circuit 35 determines whether information is obtained for all transmitters to be installed. For example, when the device information creation circuit 35 receives a signal indicating completion of the setting of the transmitters inputted by an operation of the user on the input device 25a, the device information creation circuit 35 proceeds to the process of step S11f. For example, when the device information creation circuit 35 receives a signal requesting the setting of a new transmitter inputted by an operation of the user on the input device 25a, the device information creation circuit 35 repeats the processes from step S11a.

(Step S11f) The device information creation circuit 35 obtains the installation candidate locations (installation candidate points) of the receiver inputted by an operation of the user on the input device 25a. Multiple installation candidate points are inputted. For example, the configuration may be such that the user specifies each installation candidate point, with the input device 25a such as a mouse, on a screen of the display 24a on which three-dimensional data like as illustrated in FIG. 8 is displayed, and the device information creation circuit 35 thereby obtains the coordinates of the specified installation candidate point.

(Step S11g) The device information creation circuit 35 obtains the setting range and the setting interval of the neighboring points inputted by an operation of the user on the input device 25a.

(Step S11h) The device information creation circuit 35 sets multiple neighboring points for each installation candidate point, based on the obtained setting range and setting interval of the neighboring points.

Figure 10:
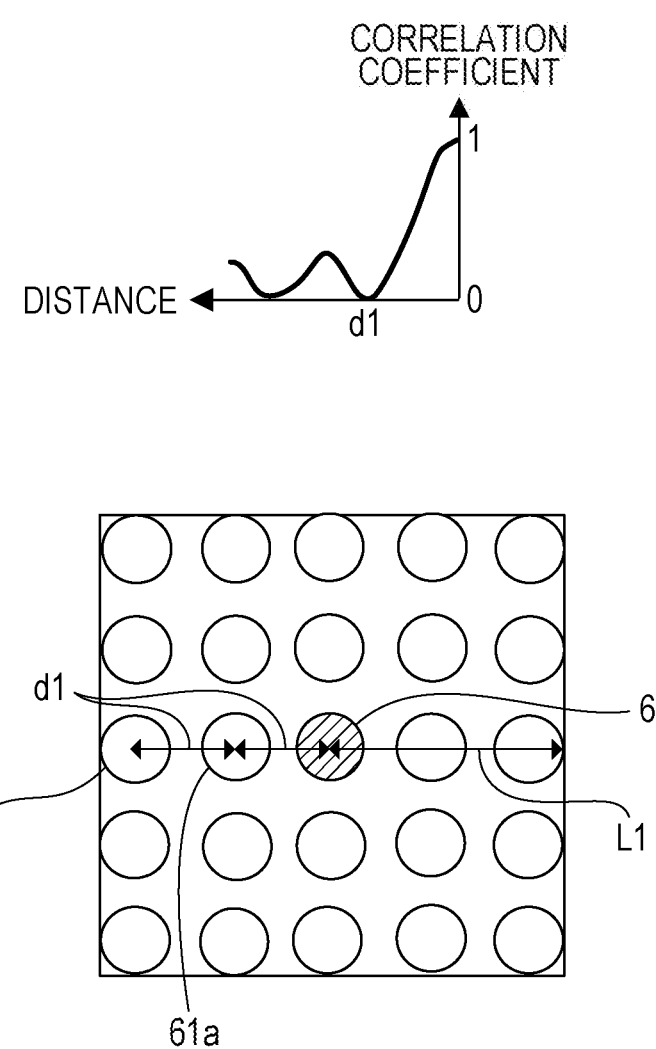
FIG. 10 is a view illustrating an example of setting of neighboring points.

FIG. 10 is a view illustrating an example of the setting of the neighboring points. Multiple neighboring points (for example, neighboring points 61a) are set at positions away from an installation candidate point 60 by a distance d1 and multiple neighboring points (for example, neighboring points 61b) are further set around the neighboring points 61a at intervals of the distance d1. The multiple neighboring points are set within a rectangular region which is a range of length L1 from the installation candidate point 60.

The neighboring points are set in consideration of a spatial correlation of a spatial fading relative to the installation candidate point 60. The spatial fading may be expressed by a Rayleigh distribution or a Nakagami-Rice distribution. The spatial fading according to the Rayleigh distribution is referred to as Rayleigh fading. FIG. 10 illustrates an example of a spatial correlation characteristic of the Rayleigh fading. The vertical axis represents the correlation coefficient and the horizontal axis represents the receiving point (in the example of FIG. 10, the distance from the installation candidate point 60).

For example, it is known from Karasawa, Y, Dejitaru Idou Tsushin no Denpa Denpan Kiso [Basics of Radio Wave Propagation in Digital Mobile Communication], First Edition, CORONA PUBLISHING CO., LTD, Mar. 17 2003, p. 67 and p. 88 that setting the distance from the receiving point to be about 0.4 times the wavelength $\lambda$ of the radio wave causes the spatial correlation to be close to 0.

Accordingly, for example, when the neighboring points are to be set at positions where the spatial correlation is close to 0, the distance d1 is set to a value obtained by multiplying the wavelength by a constant such as d1=0.4$\lambda$ so that the neighboring points are set at positions where the distance from the installation candidate point 60 is 0.4$\lambda$.

Meanwhile, the length L1 is set in consideration of calculation accuracy and calculation amount. The longer the length L1 is, (the larger the installation range is), the more the neighboring points are set. Accordingly, in a process of estimating the received signal strength to be described later, the calculation accuracy is expected to be improved but the calculation amount increases. In the example of FIG. 10, when d1=0.4$\lambda$ and L1=0.8$\lambda$, 24 neighboring points are set around the installation candidate point 60.

Note that the device information creation circuit 35 may obtain a ratio between the setting range of the neighboring points and the wavelength (0.8 in the aforementioned example) and the ratio between the setting interval of the neighboring points and the wavelength (0.4 in the aforementioned embodiment) which are inputted by an operation of the user on the input device 25a. Then, the device information creation circuit 35 may calculate the setting range of the neighboring points and the setting interval of the neighboring points based on the obtained ratios and register the calculated setting range and setting interval in the neighboring point setting information table 36e as illustrated in FIG. 5.

Moreover, although the neighboring points are set on one plane relative to the installation candidate point 60 in the aforementioned example, the neighboring points may be set three-dimensionally around the installation candidate point 60.

(Steps S11*i*, S11*j*) The device information creation circuit 35 obtains the antenna ID, the tilt angle, and the pointing direction of the receiver which are inputted by an operation of the user on the input device 25*a*.

(Step S11*k*) The device information creation circuit 35 determines whether information is obtained for all receivers to be installed. For example, when the device information creation circuit 35 receives a signal indicating completion of the setting of the receivers inputted by an operation of the user on the input device 25*a*, the device information creation circuit 35 proceeds to the process of step S11*l*. For example, when the device information creation circuit 35 receives a signal requesting the setting of a new receiver inputted by an operation of the user on the input device 25*a*, the device information creation circuit 35 repeats the processes from step S11*f*.

(Step S11*l*) The device information creation circuit 35 registers the information obtained in the processes up to step S11*k* in, for example, the transmitter information table 36*a*, the receiver information table 36*b*, and the neighboring point information table 36*d* to store the device information in the environment information storage circuit 34. The creation of the device information is thereby competed.

Note that the aforementioned order of the processes of steps S11*a* to S11*l* is an example, and the order is not limited to the one described above. The order of the processes may be switched as appropriate.

Figure 11:
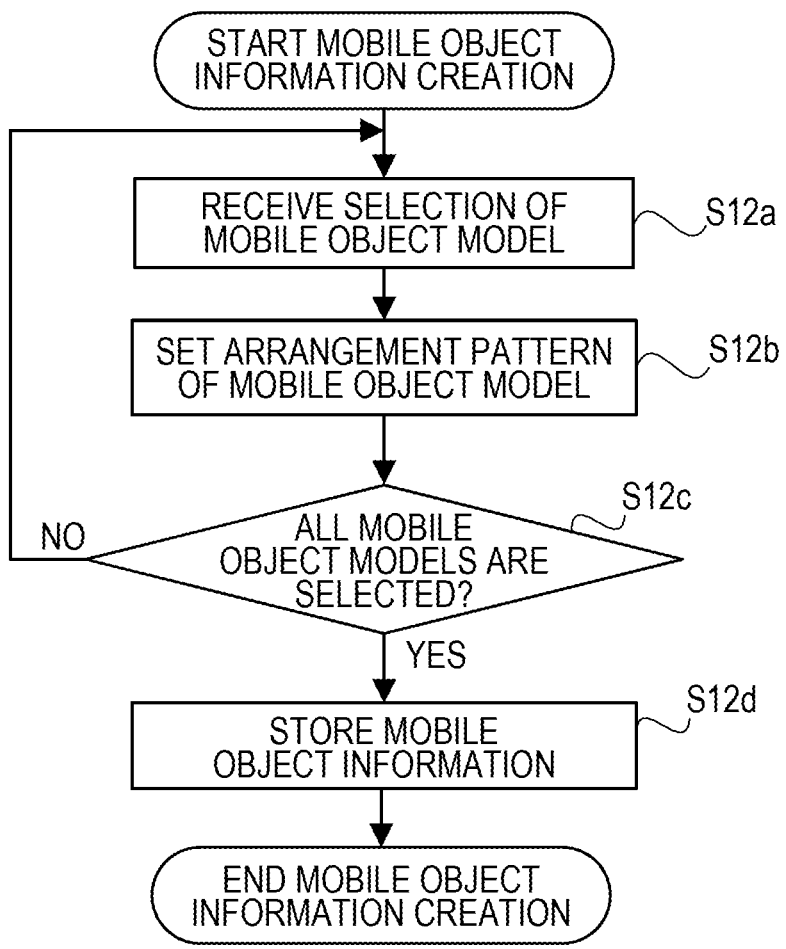
FIG. 11 is a flowchart illustrating a flow of an example of a mobile object information creation process.

FIG. 11 is a flowchart illustrating a flow of an example of a mobile object information creation process.

(Step S12*a*) The mobile object information creation circuit 33 receives selection of a mobile object model made by an operation of the user on the input device 25*a*. For example, the user specifies a file including coordinates indicating the three-dimensional shape of a desired mobile object model, a material of the model, and the like.

(Step S12*b*) The mobile object information creation circuit 33 sets an arrangement pattern of the mobile object model based on, for example, a moving range of the mobile object model inputted by an operation of the user on the input device 25*a*.

Figure 12:
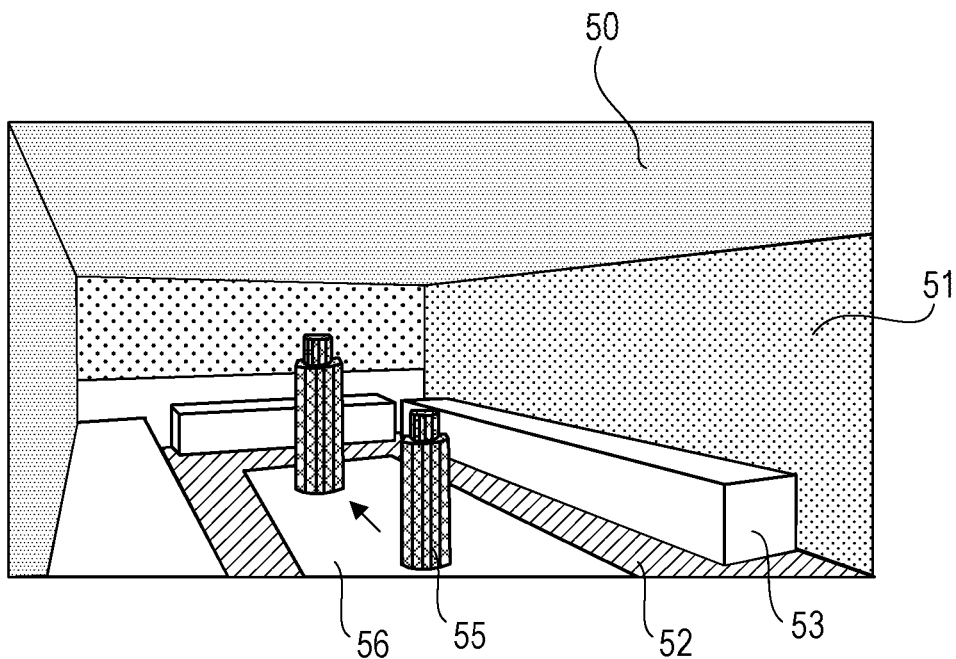
FIG. 12 is a view illustrating an example of a moving range of a mobile object model.

FIG. 12 is a view illustrating an example of the moving range of the mobile object model.

FIG. 12 illustrates an example in which a mobile object model 55 of a person is arranged in the three-dimensional data of the facility illustrated in FIG. 8. For example, a moving range 56 in which the mobile object model 55 moves is set on the screen of the display 24*a* by an operation of the user on the input device 25*a*. The mobile object information creation circuit 33 sets positions (arrangement pattern) at which the mobile object model 55 is arranged, at certain intervals in the set moving range 56.

(Step S12*c*) The mobile object information creation circuit 33 determines whether all mobile object models are selected. When not all of the mobile object models are selected, the mobile object information creation circuit 33 repeats the processes from step S12*a*. When all mobile object models are selected, the mobile object information creation circuit 33 performs the process of step S12*d*.

(Step S12*d*) The mobile object information creation circuit 33 registers, for example, the file name of the specified mobile object model, the coordinates of the set arrangement pattern, and the number of arrangement patterns in the mobile object information table 34*b* to store the mobile object information in the environment information storage circuit 34. The creation of the mobile object information is thereby completed.

Next, an example of the static simulation in step S13 is described.

The static simulation circuit 37 obtains, for example, the information in the layout information table 34*a* and the material information table 34*c* out of the environment information stored in the environment information storage circuit 34 illustrated in FIG. 4. Then, the static simulation circuit 37 performs the simulation using the ray tracing method based on the obtained information without considering the mobile object to calculate the received signal strengths at all installation candidate points and all neighboring points.

Figure 13:
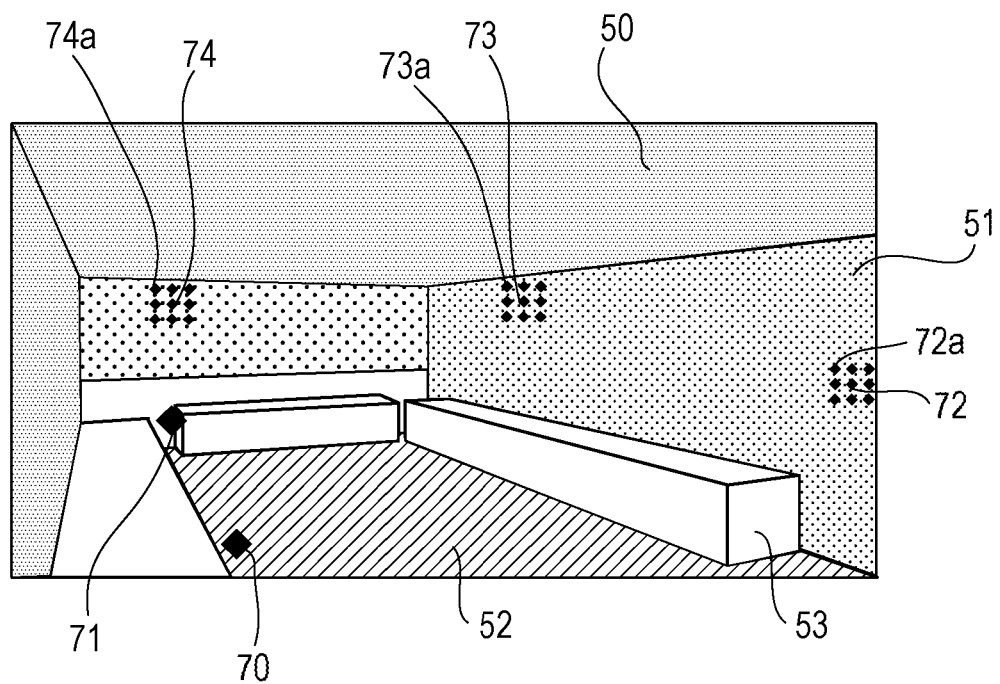
FIG. 13 is a view illustrating an example in which an environment for which static simulation is performed is displayed on a display.

FIG. 13 is a view illustrating an example in which an environment for which the static simulation is performed is displayed on the display. FIG. 13 illustrates a state where the transmission points, the installation candidate points of the receiver, and the neighboring points are set in the three-dimensional image of the inside of the facility illustrated in FIG. 8. In the example of FIG. 13, there are illustrated transmission points 70, 71 of two transmitters, three installation candidate points 72, 73, 74 of the receiver, and multiple neighboring points (for example, neighboring points 72*a*, 73*a*, 74*a*) set for the installation candidate points 72 to 74.

The static simulation circuit 37 calculates the received signal strengths of the radio wave transmitted from each of the transmission points 70, 71, at all installation candidate point and all neighboring points. The received signal strengths at the neighboring points are registered in, for example, the neighboring point information table 36*d* as illustrated in FIG. 5. Moreover, the received signal strengths at the installation candidate points may be registered in, for example, the receiver information table 36*b* as illustrated in FIG. 5.

Figure 14:
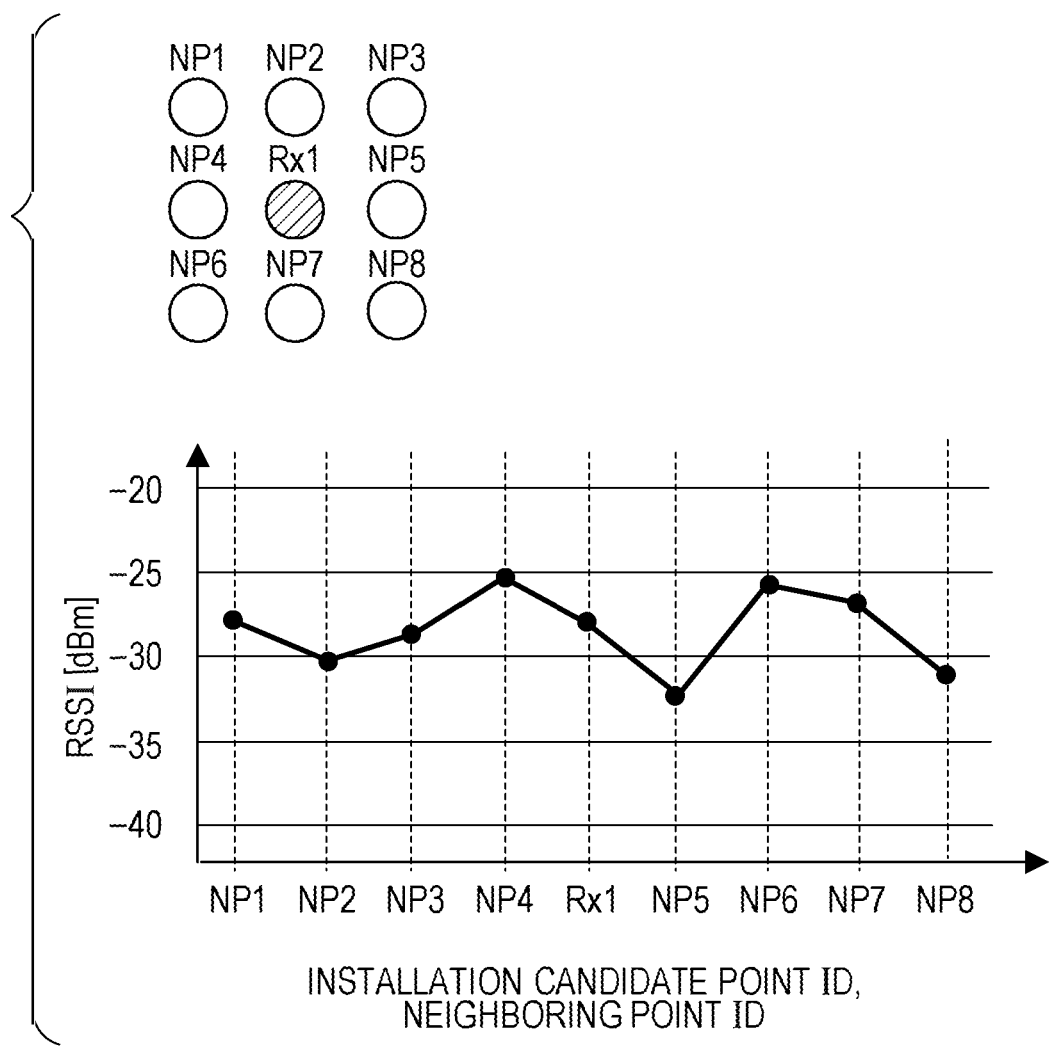
FIG. 14 is a view illustrating an example of a static simulation result.

Next, an example of the process in step S14 is described. FIG. 14 is a view illustrating an example of a static simulation result. The vertical axis represents a received signal strength indicator (RSSI) [dBm] indicating the received signal strength, and the horizontal axis represents the installation candidate point ID and the neighboring point ID.

In the example of FIG. 14, there is illustrated the RSSI at each point obtained in the static simulation in the case where eight neighboring points with the neighboring point IDs of NP1 to NP8 are set near the installation candidate point with the installation candidate point ID of Rx1.

In the process in step S14, the maximum and minimum point extraction circuit 38 extracts, for each installation candidate point, the maximum strength point and the minimum strength point from a group including the installation candidate point and the multiple neighboring points of the installation candidate point, based on the static simulation result as described above.

When the static simulation result as illustrated in FIG. 14 is obtained, the neighboring point with the neighboring point ID of NP4 is extracted as the maximum strength point and the neighboring point with the neighboring point ID of NP5 is extracted as the minimum strength point. The maximum and minimum point extraction circuit 38 registers the IDs of the extracted maximum strength point and minimum strength point in, for example, the receiver information table 36*b* illustrated in FIG. 5.

Next, an example of the process in step S15 is described. The mobile object simulation circuit 39 obtains the IDs of the maximum strength point and minimum strength point registered in, for example, the receiver information table 36b. Then, the mobile object simulation circuit 39 performs the mobile object simulation for only the maximum strength point and the minimum strength point and calculates the received signal strengths for each arrangement pattern of the mobile object.

Figure 15:
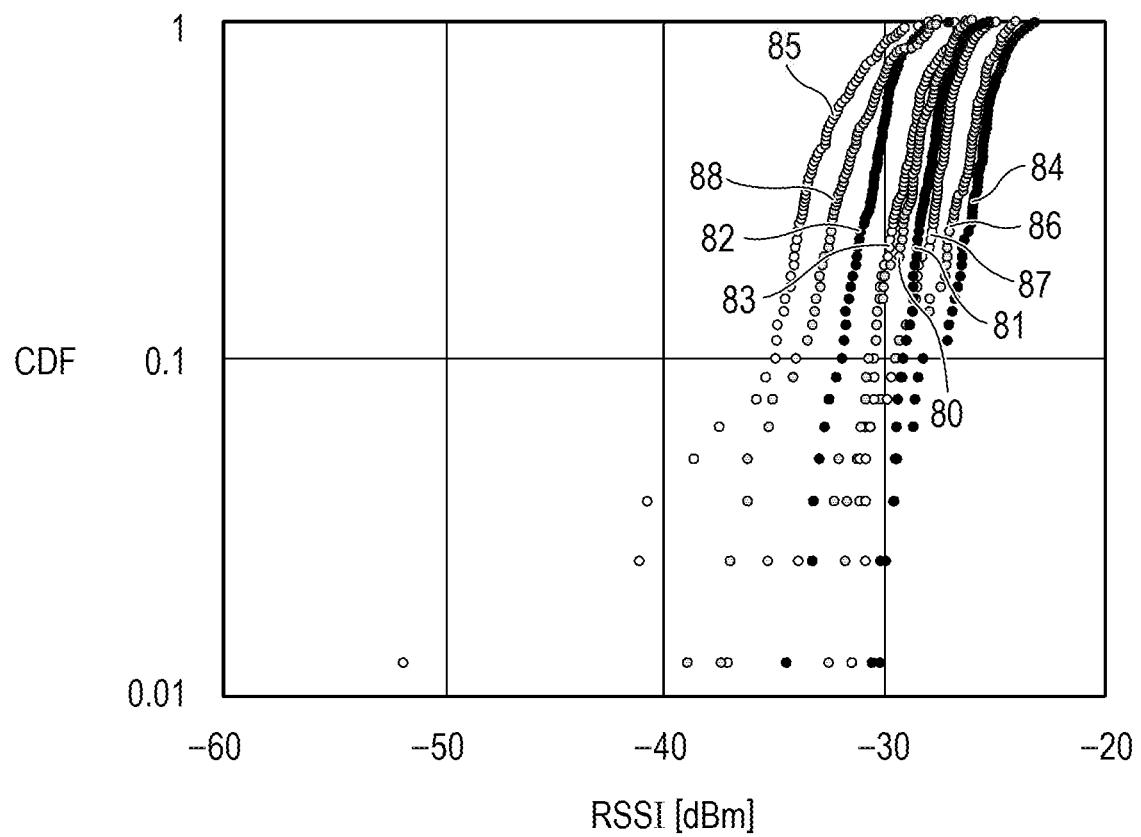
FIG. 15 is a graph illustrating an example of a result of simulation performed in consideration of the mobile object for a certain installation candidate point and all of its neighboring points.

Description is given below of the reason for performing the mobile object simulation only for the maximum strength point and the minimum strength point. FIG. 15 is a graph illustrating an example of a result of simulation performed in consideration of the mobile object for a certain installation candidate point and all of its neighboring points. The vertical axis represents a cumulative distribution function (CDF) of RSSI and the horizontal axis represents RSSI [dBm].

FIG. 15 illustrates the CDF of RSSI in each arrangement pattern of the mobile object, at each of the installation candidate point and the eight neighboring points where the RSSIs as illustrated in FIG. 14 are obtained in the static simulation.

A plot group 80 illustrates the CDF of RSSI at the installation candidate point with the installation candidate point ID of Rx1. A plot group 81 illustrates the CDF of RSSI at the neighboring point with the neighboring point ID of NP1, a plot group 82 illustrates the CDF of RSSI at the neighboring point with the neighboring point ID of NP2, and a plot group 83 illustrates the CDF of RSSI at the neighboring point with the neighboring point ID of NP3. A plot group 84 illustrates the CDF of RSSI at the neighboring point with the neighboring point ID of NP4, a plot group 85 illustrates the CDF of RSSI at the neighboring point with the neighboring point ID of NP5, and a plot group 86 illustrates the CDF of RSSI at the neighboring point with the neighboring point ID of NP6. A plot group 87 illustrates the CDF of RSSI at the neighboring point with the neighboring point ID of NP7 and a plot group 88 illustrates the CDF of RSSI at the neighboring point with the neighboring point ID of NP8.

The smaller the received signal strength at the installation candidate point or the neighboring point obtained in the static simulation is, the greater the change in RSSI obtained in the mobile object simulation is. Accordingly, as illustrated by the plot group 85, the change in the RSSI is greatest at the neighboring point with the neighboring point ID of NP5 which is the minimum strength point in the static simulation. Meanwhile, as illustrated by the plot group 84, the change in the RSSI is smallest at the neighboring point with the neighboring point ID of NP4 which is the maximum strength point in the static simulation.

Accordingly, by performing the mobile object simulation only for the maximum strength point and the minimum strength point to calculate the received signal strengths at these points, it is possible to estimate the received signal strengths at the installation candidate point or the neighboring points other than the maximum strength point and the minimum strength point based on the calculated received signal strengths.

Figure 16:
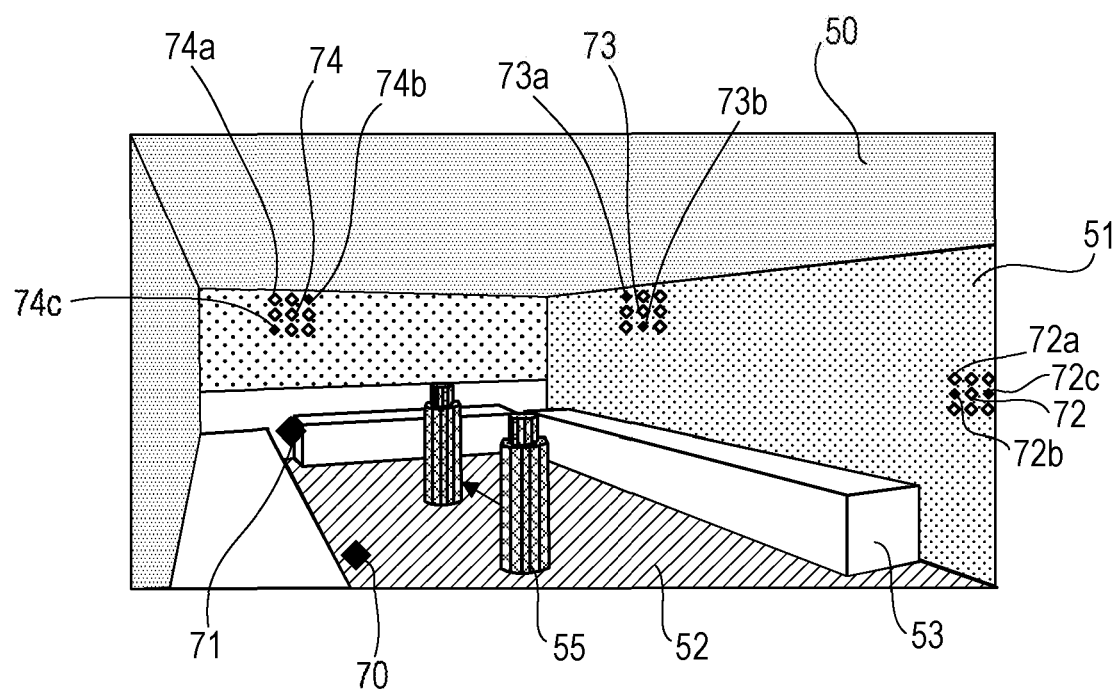
FIG. 16 is a view illustrating an example in which an environment for which mobile object simulation is performed is displayed on the display.

FIG. 16 is a view illustrating an example in which an environment for which the mobile object simulation is performed is displayed on the display. In FIG. 16, the same elements as the elements illustrated in FIG. 13 are denoted by the same reference numerals.

FIG. 16 illustrates a state where the transmission points, the installation candidate points of the receiver, the neighboring points, and the mobile object model are set in the three-dimensional image as in FIG. 13. However, in the example of FIG. 16, the mobile object model 55 is illustrated and two points of the maximum strength point and the minimum strength point in each group including the installation candidate point and its neighboring points are illustrated by being plotted in black. In the example of FIG. 16, one of neighboring points 72b, 72c included in eight neighboring points of an installation candidate point 72 is the maximum strength point and the other one is the minimum strength point. Moreover, one of the neighboring points 73a, 73b included in eight neighboring points of an installation candidate point 73 is the maximum strength point and the other one is the minimum strength point. Furthermore, one of neighboring points 74b, 74c included in eight neighboring points of an installation candidate point 74 is the maximum strength point and the other one is the minimum strength point.

In the process in step S15, the mobile object simulation circuit 39 performs the mobile object simulation only for the maximum strength point and the minimum strength point as described above to calculate the received signal strengths at these points. The received signal strengths of the neighboring points are registered in, for example, the neighboring point information table 36d as illustrated in FIG. 5. Moreover, the received signal strength at the installation candidate point may be registered in, for example, the receiver information table 36b as illustrated in FIG. 5.

Next, an example of the process in step S16 is described. It is confirmed from, for example, experiments and the simulation result illustrated in FIG. 15 that a ratio between the received signal strength indicators (RSSIs) at any two of the installation candidate point and its multiple neighboring points obtained in the static simulation tends to be maintained in the mobile object simulation. Accordingly, the received signal strength estimation circuit 40 calculates a received signal strength $RSSIm_i$ at a point i, being the installation candidate point or the neighboring point for which no mobile object simulation is performed, in the case where the mobile object is arranged at a certain position, based on, for example, the following formula (1).

$$RSSIm_i = RSSIm_{max} - (RSSIm_{max} - RSSIm_{min}) \times (RSSIs_{max} - RSSIs_i)/(RSSIs_{max} - RSSIs_{min}) \qquad (1)$$

In the formula (1), $RSSIm_{max}$ is the received signal strength at the maximum strength point in the case where the mobile object is arranged at the certain position, and $RSSIm_{min}$ is the received signal strength at the minimum strength point in the case where the mobile object is arranged at the certain position. Moreover, $RSSIs_{max}$ is the received signal strength at the maximum strength point calculated in the static simulation, and $RSSIs_{min}$ is the received signal strength at the minimum strength point calculated in the static simulation. $RSSIs_i$ is the received signal strength at the point i calculated in the static simulation.

Figure 17:
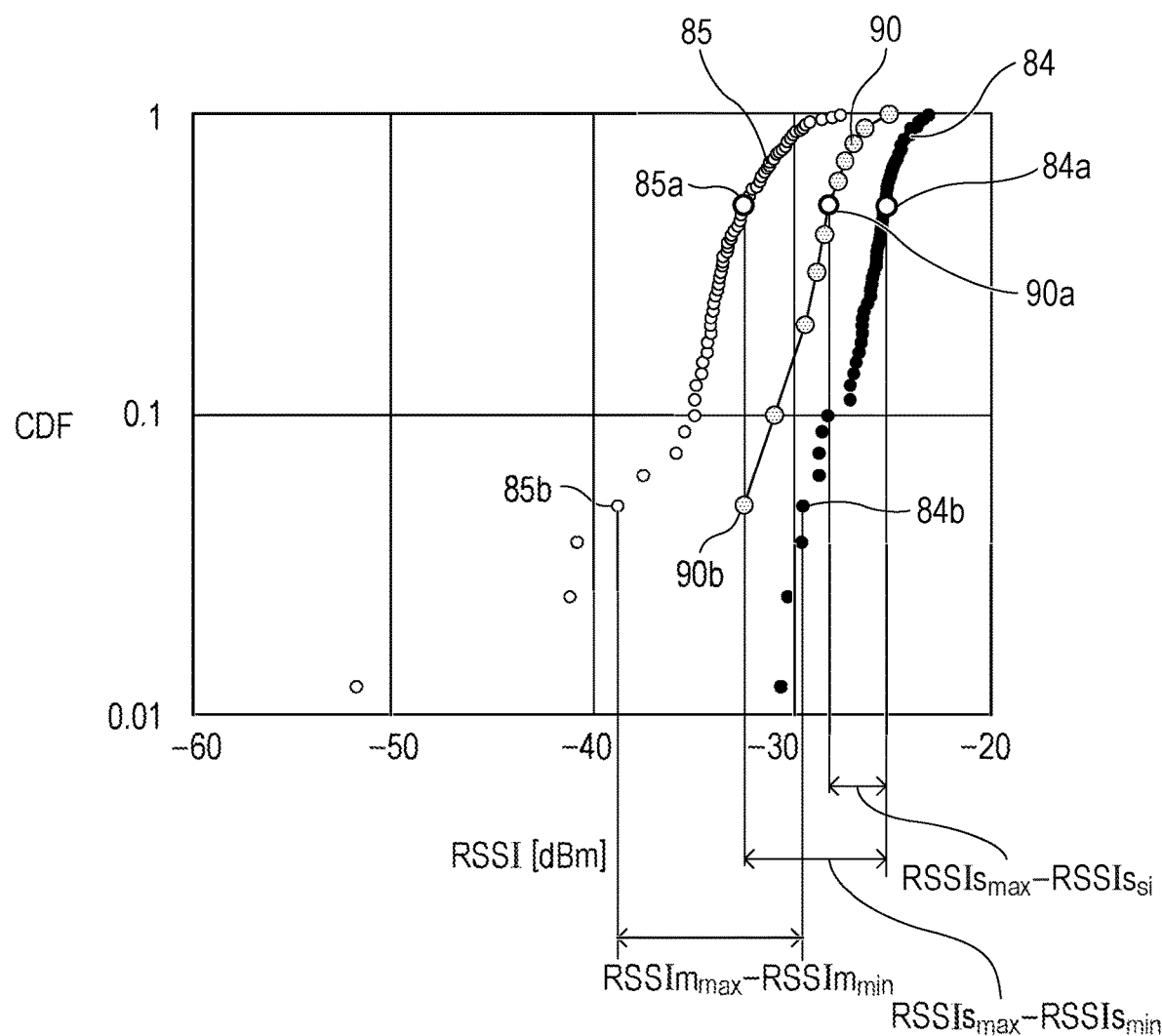
FIG. 17 is a graph illustrating an example of estimation of the received signal strength.

FIG. 17 is a graph illustrating an example of estimation of the received signal strength. The vertical axis represents the CDF of RSSI and the horizontal axis represents the RSSI [dBm]. FIG. 17 illustrates the plot group 84 illustrating the CDF of RSSI at the maximum strength point, the plot group 85 illustrating the CDF of RSSI at the minimum strength point, and a plot group 90 illustrating the CDF of RSSI at the installation candidate point calculated (estimated) by using the formula (1).

FIG. 17 illustrates examples of $RSSIm_{max} - RSSIm_{min}$, $RSSIs_{max} - RSSIs_{min}$, and $RSSIs_{max} - RSSIs_i$ in the formula (1). Note that, although the plot groups 84, 85 illustrate the CDF of RSSI obtained in the mobile object simulation, the RSSI at each of plots 84a, 85a is set to be the same as a value obtained in the static simulation. Moreover, the RSSI at a plot 90*a* is set to be the same as a value obtained at the installation candidate point in the static simulation.

For example, the RSSI at a plot 90*b* is calculated based on the RSSIs at plots 84*b*, 85*b* with the same CDF. Specifically, a difference between the RSSI at the plot 84*b* and the RSSI at the plot 85*b* is used as $RSSIm_{max} - RSSIm_{min}$ in the formula (1) and the RSSI at the plot 84*b* is used as $RSSIm_{max}$.

The received signal strength estimation circuit 40 is capable of similarly estimating the RSSIs at other plots included in the plot group 90 and the RSSIs at not-illustrated other neighboring points. However, the received signal strength estimation circuit 40 may estimate only the RSSIs at one CDF value used for evaluation to be described later.

Moreover, the received signal strength estimation circuit 40 may estimate the received signal strengths at all of the installation candidate points or the neighboring points for which no mobile object simulation is performed or may estimate the received signal strengths at only the installation candidate points for which no mobile object simulation is performed.

Next, an example of the process in step S17 is described. The installation location determining-outputting circuit 41 determines the received signal strength at each installation candidate point, based on the received signal strengths calculated by the mobile object simulation circuit 39 and the received signal strength estimation circuit 40. The installation location determining-outputting circuit 41 calculates, for example, the average value of the received signal strengths described below as the received signal strength in each installation candidate location. The calculated received signal strength is an evaluation value for evaluating each installation candidate point.

For example, when eight neighboring points are set for one installation candidate point, the installation location determining-outputting circuit 41 calculates the average value of the received signal strengths at a certain CDF value at two points obtained in the mobile object simulation and the received signal strengths at seven points which are estimated from the received signal strengths obtained in the mobile object simulation. Note that, when no mobile object simulation is performed for the installation candidate point, the installation location determining-outputting circuit 41 may calculate the average value of the received signal strengths at a certain CDF value at two neighboring points obtained in the mobile object simulation and the received signal strength at the installation candidate point estimated from the received signal strengths obtained in the mobile object simulation. This enables reduction of the calculation amount of the estimation calculation. Moreover, the installation location determining-outputting circuit 41 may calculate the average value of the received signal strengths at a certain CDF value at the minimum strength point and the maximum strength point obtained in the mobile object simulation. This enables further reduction of the calculation amount. However, obtaining the average value of the received signal strengths at many points improves the reliability of the evaluation result.

Figure 18:
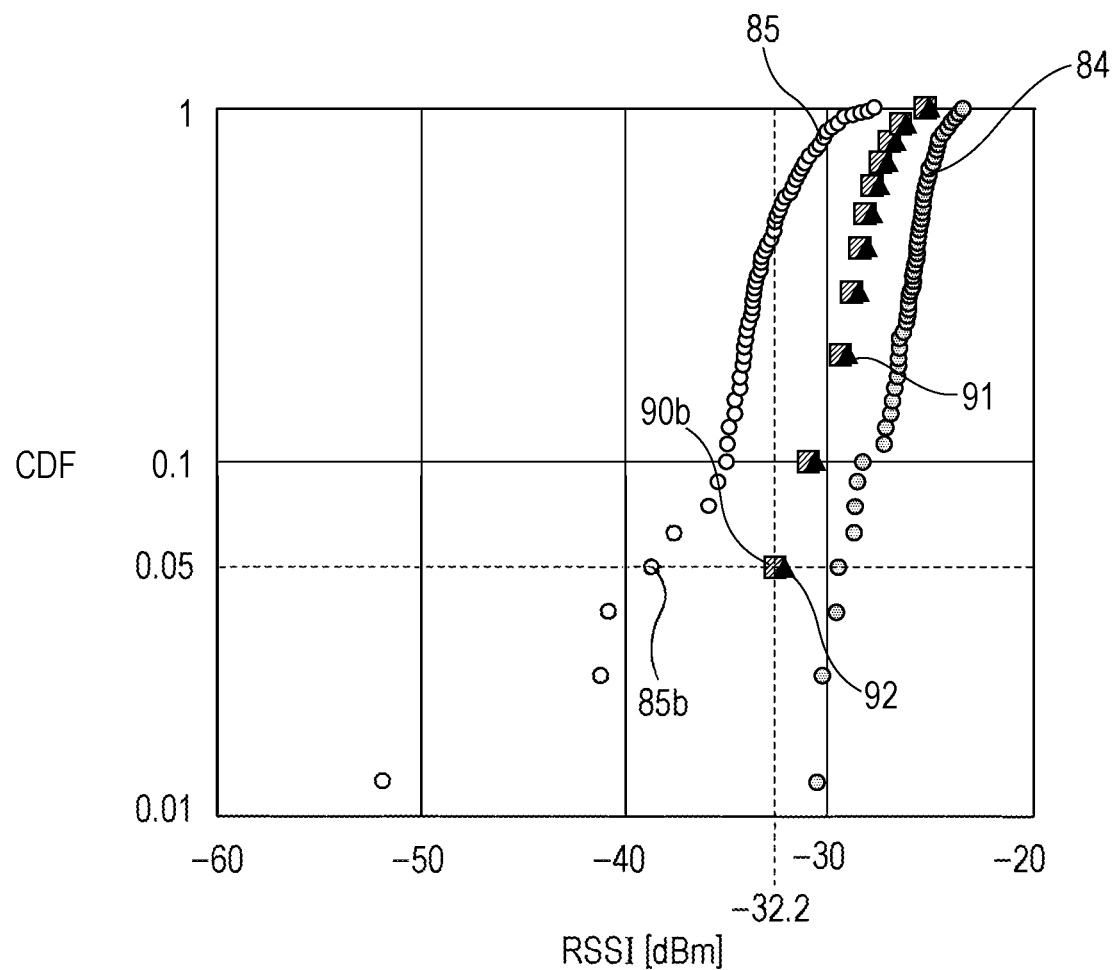
FIG. 18 is a graph illustrating a calculation example of an average value.

FIG. 18 is a graph illustrating a calculation example of the average value. The vertical axis represents the CDF of RSSI and the horizontal axis represents the RSSI [dBm]. In FIG. 18, the same elements as the elements illustrated in FIG. 17 are denoted by the same reference numerals. FIG. 18 illustrates the average value of the RSSIs at the maximum strength point, the minimum strength point obtained in the mobile object simulation and the installation candidate point estimated from these RSSIs, by using multiple plots (for example, plots 91, 92). Note that, in the example of FIG. 18, the multiple plots indicating the average value substantially coincide with multiple plots (for example, plot 90*b*) indicating the estimation value of the received signal strength at the installation candidate point.

The average value of the RSSIs at the maximum strength point, the minimum strength point obtained in the mobile object simulation, the at the other neighboring points, the installation candidate point estimated from these RSSIs also has characteristics similar to those of the plots 91, 92 in FIG. 18.

The installation location determining-outputting circuit 41 sets, for example, the RSSI (−32.2 dBm in the example of FIG. 18) of the plot 92 where the CDF is 0.05 as the evaluation value. Alternatively, the installation location determining-outputting circuit 41 may determine the RSSI at the minimum strength point (for example, RSSI at the plot 85*b*) obtained in the mobile object simulation as the evaluation value. In this case, the process of estimating the received signal strengths in step S16, the mobile object simulation for the maximum strength point, and the like are unnecessary and it is possible to reduce the calculation amount. However, the determined evaluation value is smaller than the aforementioned evaluation value which is the average value.

The installation location determining-outputting circuit 41 determines the received signal strength (evaluation value) in each installation candidate location and, for example, determines the installation candidate location where the received signal strength is greater than the lower limit (receiving sensitivity) of the RSSI at which reception of the radio wave by the receiver to be installed is possible, as the installation location of the receiver. For example, when the receiving sensitivity of the receiver to be installed is −80 dBm, the installation location determining-outputting circuit 41 determines the installation candidate location where the received signal strength is −80 dBm or more at the CDF of 0.05, as the installation location of the receiver so that the receiver may receive the radio wave at a probability of 95%.

When there are multiple transmitters, the installation location determining-outputting circuit 41 preferably sets the installation candidate location where the received signal strengths of the radio waves from the multiple transmitters are equal to or greater than the receiving sensitivity, as the installation location of the receiver. This is because such setting allows one receiver to receive the radio waves of the multiple transmitters and enables reduction of the number of receivers to be installed.

Figure 19:
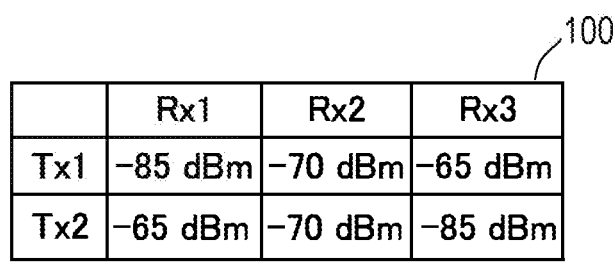
FIG. 19 is a table illustrating an example of the received signal strengths at three installation candidate locations which are calculated for two transmitters.

FIG. 19 is a table illustrating an example of the received signal strengths in three installation candidate locations which are calculated for two transmitters. A table 100 includes received signal strengths determined for the three installation candidate locations with the installation candidate point IDs of "Rx1", "Rx2", and "Rx3". The received signal strengths are each, for example, the aforementioned average value at the CDF of 0.05. The received signal strengths are determined for each of the two transmitters with the device IDs of "Tx1", "Tx2".

When the receiving sensitivity of the receiver to be installed is −80 dBm and the received signal strengths as illustrated in FIG. 19 are obtained, the installation location determining-outputting circuit 41 determines the installation candidate location of "Rx2" where the received signal strengths calculated for both transmitters exceed the receiving sensitivity, as the installation location of the receiver. Then, the installation location determining-outputting circuit 41 outputs the determined installation location to the calculation result storage circuit 42. The calculation result storage circuit 42 stores the installation location. Note that the calculation result storage circuit 42 may store data of the table 100 as illustrated in FIG. 19.

Figure 20:
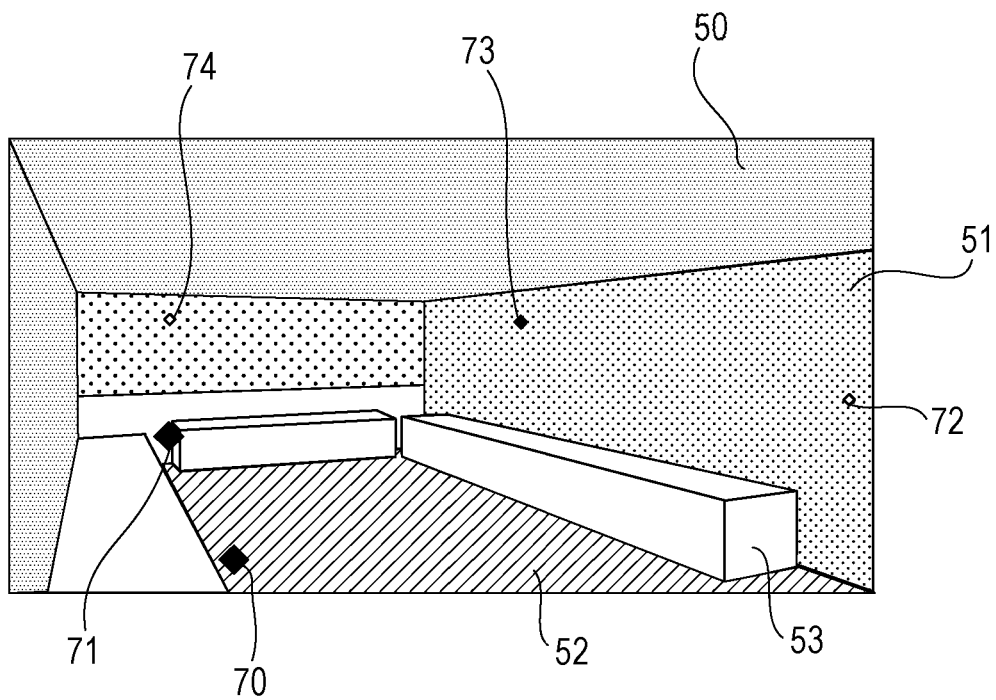
FIG. 20 is a view illustrating a display example of the installation location of the receiver.

Moreover, the installation location determining-outputting circuit 41 may display the determined installation location on the display 24a illustrated in FIG. 2. FIG. 20 is a view illustrating a display example of the installation location of the receiver.

FIG. 20 illustrates an example in which the installation candidate point 73 determined to be the installation location among the three installation candidate points 72 to 74 is displayed in a highlighted manner. Next, effects of the installation location determination method of the embodiment are described.

Figure 21:
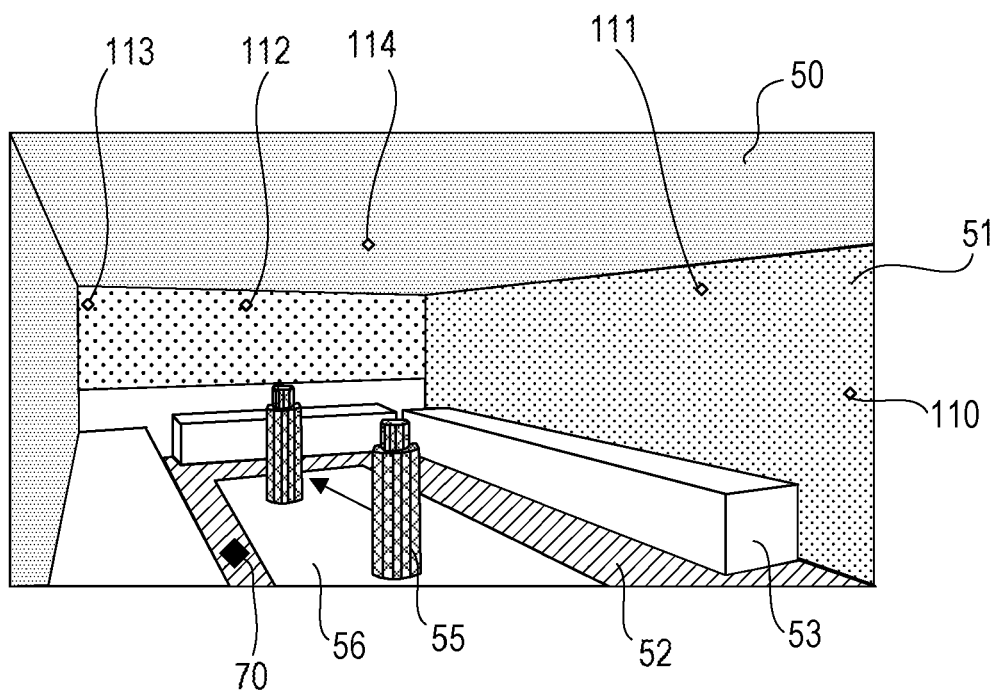
FIG. 21 is a view illustrating various setting examples used to evaluate effects.

FIG. 21 is a view illustrating various setting examples used to evaluate the effects. In FIG. 21 the same elements as the elements described above are denoted by the same reference numerals. In FIG. 21, five installation candidate points 110, 111, 112, 113, 114 are set.

Figure 22:
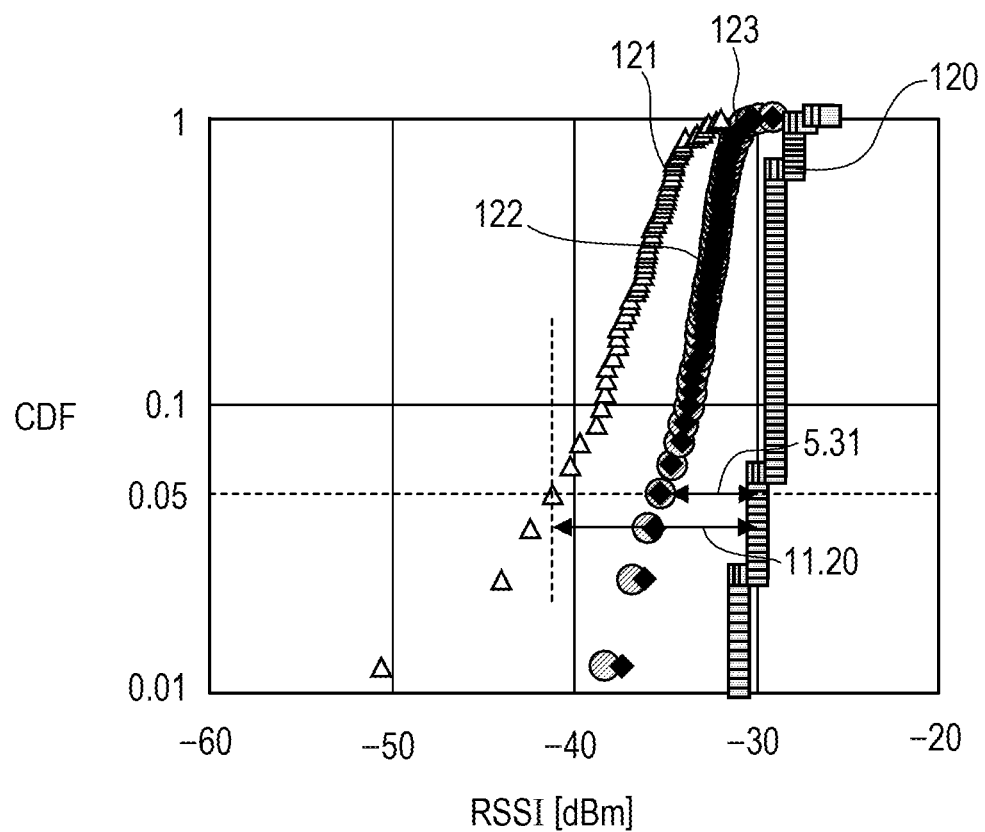
FIG. 22 is a graph illustrating an example of an actual measurement result and simulation results in an installation candidate location with one installation candidate point at the center.

FIG. 22 is a graph illustrating an example of an actual measurement result and simulation results in an installation candidate location with one of the installation candidate points at the center. The vertical axis represents the CDF of RSSI and the horizontal axis represents the RSSI [dBm].

FIG. 22 illustrates the actual measurement result and the simulation results of the CDF of RSSI in the installation candidate location with the installation candidate point 111 at the center in the case where a mobile object (person) is arranged in the moving range 56 illustrated in FIG. 21 in a certain arrangement pattern.

A plot group 120 illustrates an actual measurement result, and a plot group 121 illustrates a simulation result in the case where the mobile object simulation is performed for the installation candidate point 111 without setting the neighboring points for the installation candidate point 111. Plot groups 122, 123 substantially coincide with each other. The plot group 122 illustrated by multiple plots of circular symbols illustrates the CDF of the average value of the RSSIs obtained by setting eight neighboring points for the installation candidate point 111 and performing mobile object simulation for total of nine points. The plot group 123 illustrated by plots of rhombus-shaped symbols illustrates a simulation result obtained by using the installation location determination method in the second embodiment. In the example of FIG. 22, the plot group 123 illustrates the CDF of the value obtained by estimating the RSSIs at seven of the nine points set for the installation candidate point 111 from the RSSIs obtained in the mobile object simulation at the maximum strength point and the minimum strength point and by averaging the RSSIs at the nine points.

As illustrated in FIG. 22, when the mobile object simulation is performed for the installation candidate point 111 without setting the neighboring points for the installation candidate point 111, a difference from the actual measurement result of the RSSI at the CDF of 0.05 is 11.20 dB. Meanwhile, in the simulation result obtained by using the installation location determination method in the second embodiment, the difference from the actual measurement result of the RSSI at the CDF of 0.05 is 5.31 dB and is smaller than the difference in the case where no neighboring points are set.

FIG. 23 is a table illustrating an example of a difference between the actual measurement result and each of the simulation results at each of the installation candidate points. FIG. 23 illustrates a difference between the actual measurement result and each of three simulation results obtained at each of the installation candidate points 110 to 114 (denoted by installation candidate point IDs "Rx1" to "Rx5") illustrated in FIG. 21. The actual measurement result and the simulation results indicate the RSSIs (unit is dBm) at the CDF of 0.05.

The first of the three simulation results is a result obtained by performing simulation (mobile object simulation) at one point, that is the installation candidate point without setting the neighboring points. The second of the three simulation results is a result obtained by setting eight neighboring points for each installation candidate point and performing simulation for nine points. The third of the three simulation results is a simulation result obtained by performing simulation for two points of the maximum strength point and the minimum strength point and estimating the RSSIs at other seven points.

As illustrated in FIG. 23, in the installation location determination method in the second embodiment, it is possible to reduce the difference from the actual measurement value of the RSSI at the installation candidate location, from that in the case where the simulation is performed for one point, that is the installation candidate point. In other words, it is possible to improve the calculation accuracy of the RSSI at the installation candidate location.

Moreover, the simulation result obtained by using the installation location determination method of the embodiment is substantially the same as the simulation result obtained by setting eight neighboring points for the installation candidate point and performing the mobile object simulation for total of nine points. In the installation location determination method of the embodiment, since the received signal strengths at two points are calculated by the mobile object simulation, it is possible to reduce the simulation time to about ⅔ of that in the case of calculating the received signal strengths at all nine points by the mobile object simulation.

Moreover, it is possible to reduce the number of times of simulation when the simulation is performed for both of the condition in which the mobile object is absent and the condition in which the mobile object is present. For example, assume that number of times of simulation=number of installation candidate points×number of neighboring points+number of installation candidate points×number of arrangement patterns×number of neighboring points. Assume a case where the number of installation candidate points, the number of neighboring points, and the number of arrangement patterns are all 10. In this case, when the mobile object simulation is performed also for all neighboring points, the number of times of simulation is 10×10+10×10×10=1100. Meanwhile, when the mobile object simulation is performed only for two neighboring points (in the case where the maximum strength point and the minimum strength point are the neighboring points), the number of times of simulation is 10×10+10×10×2=300. In other words, it is possible to reduce the number of times of simulation from that in the case where the mobile object simulation is performed for all neighboring points.

Note that the aforementioned processing contents may be achieved by causing the installation location determination device 20 as illustrated in FIG. 2 to execute a program. The program may be recorded in a computer readable recording medium (for example, the recording medium 26a). For example, a magnetic disk, an optical disc, a magneto-optical disk, a semiconductor memory, and the like may be used as the recording medium. The magnetic disk includes a FD and a HDD. The optical disc includes a CD, a CD-R (recordable), a CD-RW (rewritable), a DVD, a DVD-R, and DVD- RW. The program may be recorded in a portable recording medium to be distributed. In this case, the program may be copied from the portable recording medium to another recording medium (for example, the HDD 23) to be executed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An installation location determination device for a radio device comprising:
   a memory configured to store device information on a transmitter and a receiver that receives a radio wave transmitted by the transmitter and environment information on an environment in which communication by the transmitter and the receiver is to be performed; and
   a processor coupled to the memory, configured to:
   obtain the device information and the environment information from the memory,
   perform first simulation using a ray tracing method based on the device information and the environment information to calculate first received signal strengths at a plurality of installation candidate points and second received signal strengths at a plurality of neighboring points, the plurality of installation candidate points being located respectively at centers of a plurality of installation candidate locations where the receiver is to be installed, the plurality of neighboring points setting for, based on a ratio between a setting range of the neighboring points and a wavelength and a ratio between a setting interval of the neighboring points and the wavelength, each of the installation candidate points within a first distance from the installation candidate point, the second received signal strengths being strengths when the receiver is installed at each of the plurality of neighboring points,
   calculate third received signal strengths in the respective installation candidate locations based on a calculation result of the first received signal strengths and the second received signal strengths,
   determine an installation location of the receiver based on the third received signal strengths, and
   output the installation location.

2. The installation location determination device for a radio device according to claim 1, wherein the processor
   extracts, from a group including a first installation candidate point among the plurality of installation candidate points and the plurality of neighboring points set within the first distance from the first installation candidate point, a first point at which the first received signal strength is greatest and a second point at which the first received signal strength is smallest, the first received signal strengths calculated in the first simulation performed in a condition where a mobile object is not included in the environment,
   performs second simulation using the ray tracing method in a condition where the mobile object is included in the environment to calculate fourth received signal strengths at the first point and the second point, and
   calculates the third received signal strength based on the fourth received signal strengths.

3. The installation location determination device for a radio device according to claim 2, wherein an interval between each of the installation candidate points and each of the neighboring points corresponding to the installation candidate point is set based on a spatial correlation of spatial fading relative to the installation candidate point.

4. The installation location determination device for a radio device according to claim 2, wherein the processor
   estimates fifth received signal strengths at points other than the first point and the second point among the first installation candidate point and the plurality of neighboring points set within the first distance from the first installation candidate point, based on the fourth received signal strengths at the first point and the second point, and
   calculates the third received signal strength by obtaining an average of the fourth received signal strengths and the fifth received signal strengths.

5. The installation location determination device for a radio device according to claim 2, wherein the processor
   estimates a fifth received signal strength at the first installation candidate point based on the fourth received signal strengths at the first point and the second point, and
   calculates the third received signal strength by obtaining an average of the fourth received signal strengths and the fifth received signal strength.

6. The installation location determination device for a radio device according to claim 2, wherein the processor calculates the third received signal strength by obtaining an average of the third fourth received signal strengths at the first point and the second point.

7. The installation location determination device fora radio device according to claim 1, wherein the processor
   extracts, from a group including a first installation candidate point among the plurality of installation candidate points and the plurality of neighboring points set within the first distance from the first installation candidate point, a first point at which the first received signal strength is smallest, the first received signal strength calculated in the first simulation performed in a condition where a mobile object is not included in the environment,
   performs second simulation using the ray tracing method in a condition where the mobile object is included in the environment to calculate a fourth received signal strength at the first point, and
   determines the third received signal strength based on the fourth received signal strength.

8. A method for installation location determination of a radio device performed by a computer coupled to a memory that stores device information on a transmitter and a receiver that receives a radio wave transmitted by the transmitter and environment information on an environment in which communication by the transmitter and the receiver is to be performed, the method comprising:
   obtaining the device information and the environment information from the memory;
   performing first simulation using a ray tracing method based on the device information and the environment information to calculate first received signal strengths at a plurality of installation candidate points and second received signal strengths at a plurality of neighboring points, the plurality of installation candidate points being located respectively at centers of a plurality of installation candidate locations where the receiver is to be installed, the plurality of neighboring points setting for, based on a ratio between a setting range of the neighboring points and a wavelength and a ratio between a setting interval of the neighboring points and the wavelength, each of the installation candidate points within a first distance from the installation candidate point, the second received signal strengths being strengths when the receiver is installed at each of the plurality of neighboring points;

calculating third received signal strengths in the respective installation candidate locations based on a calculation result of the first received signal strengths and the second received signal strengths;

determining an installation location of the receiver based on the third received signal strengths; and outputting the installation location.

9. A non-transitory computer-readable recording medium having stored therein a program for causing a computer to execute a process for installation location determination of a radio device, the computer coupled to a memory that stores device information on a transmitter and a receiver that receives a radio wave transmitted by the transmitter and environment information on an environment in which communication by the transmitter and the receiver is to be performed, the process comprising:

obtaining the device information and the environment information from the memory;

performing first simulation using a ray tracing method based on the device information and the environment information to calculate first received signal strengths at a plurality of installation candidate points and second received signal strengths at a plurality of neighboring points, the plurality of installation candidate points being located respectively at centers of a plurality of installation candidate locations where the receiver is to be installed, the plurality of neighboring points setting for, based on a ratio between a setting range of the neighboring points and a wavelength and a ratio between a setting interval of the neighboring points and the wavelength, each of the installation candidate points within a first distance from the installation candidate point, the second received signal strengths being strengths when the receiver is installed at each of the plurality of neighboring points;

calculating third received signal strengths in the respective installation candidate locations based on a calculation result of the first received signal strengths;

determining an installation location of the receiver based on the third received signal strengths; and outputting the installation location.

\* \* \* \* \*